US010964621B2

(12) United States Patent
Economy et al.

(10) Patent No.: US 10,964,621 B2
(45) Date of Patent: Mar. 30, 2021

(54) MEMORY DEVICE WITH HIGH RESISTIVITY THERMAL BARRIER

(71) Applicant: Micron Technology, Inc., Boise, ID (US)

(72) Inventors: David Ross Economy, Boise, ID (US); Pengyuan Zheng, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/400,927

(22) Filed: May 1, 2019

(65) Prior Publication Data

US 2020/0350225 A1     Nov. 5, 2020

(51) Int. Cl.
*H01L 21/02* (2006.01)
*H01L 21/768* (2006.01)
*H01L 23/535* (2006.01)
*H01L 23/373* (2006.01)

(52) U.S. Cl.
CPC ...... *H01L 23/3736* (2013.01); *H01L 21/0234* (2013.01); *H01L 21/02186* (2013.01); *H01L 21/768* (2013.01); *H01L 23/535* (2013.01)

(58) Field of Classification Search
CPC ........... H01L 23/3736; H01L 21/02186; H01L 21/0234; H01L 23/535; H01L 21/768
See application file for complete search history.

(56) References Cited

U.S. PATENT DOCUMENTS

| 2004/0214430 | A1* | 10/2004 | Ruelke | H01L 21/02167 438/687 |
| 2006/0172552 | A1* | 8/2006 | Ajmera | H01L 21/0234 438/778 |
| 2008/0230916 | A1 | 9/2008 | Saito et al. | |
| 2015/0021770 | A1 | 1/2015 | Liou et al. | |
| 2017/0103948 | A1* | 4/2017 | Lee | H01L 21/76864 |
| 2017/0271434 | A1 | 9/2017 | Chou et al. | |
| 2018/0019300 | A1 | 1/2018 | Lee et al. | |
| 2018/0301460 | A1* | 10/2018 | Yoo | H01L 21/02164 |
| 2019/0148398 | A1* | 5/2019 | Kim | H01L 21/311 438/710 |
| 2019/0326214 | A1* | 10/2019 | Lin | H01L 23/5228 |

* cited by examiner

*Primary Examiner* — Hoang-Quan Ho
(74) *Attorney, Agent, or Firm* — Holland & Hart LLP

(57) ABSTRACT

Methods, systems, and devices for a memory device with a high resistivity thermal barrier are described. In some examples a barrier material may be positioned over a memory cell region, an oxide region, and/or a through-silicon via (TSV). The barrier may include a first region above the memory cell region and a second region above the TSV. A process, such as a plasma treatment, may be applied to the barrier, which may result in the first and second regions having different thermal resistivities (e.g., different densities). Accordingly, due to the different thermal resistivities, the memory cells may be thermally insulated from thermal energy generated in the memory device.

11 Claims, 10 Drawing Sheets

MEMORY DEVICE WITH HIGH RESISTIVITY THERMAL BARRIER

BACKGROUND

The following relates generally to a system with a memory device and more specifically to a memory device with a high resistivity thermal barrier.

Memory devices are widely used to store information in various electronic devices such as computers, wireless communications devices, cameras, digital displays, and the like. Information is stored by programming different states of a memory device. For example, binary devices have two states, often denoted by a logic "1" or a logic "0." In other systems, more than two states may be stored. To access the stored information, a component of the electronic device may read, or sense, the stored state in the memory device. To store information, a component of the electronic device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may include volatile memory cells or non-volatile memory cells. Non-volatile memory cells may maintain their stored logic state for extended periods of time even in the absence of an external power source. Volatile memory cells may lose their stored state over time unless they are periodically refreshed by an external power source.

In some cases, a memory device may perform an access operation (e.g., a read operation or a write operation) on a memory cell. Performing the access operation may generate heat at or near the memory cell. The generated heat may dissipate onto nearby components, such as memory cells and, in some cases may disturb the states stored by the other memory cells.

DETAILED DESCRIPTION

Figure 1:
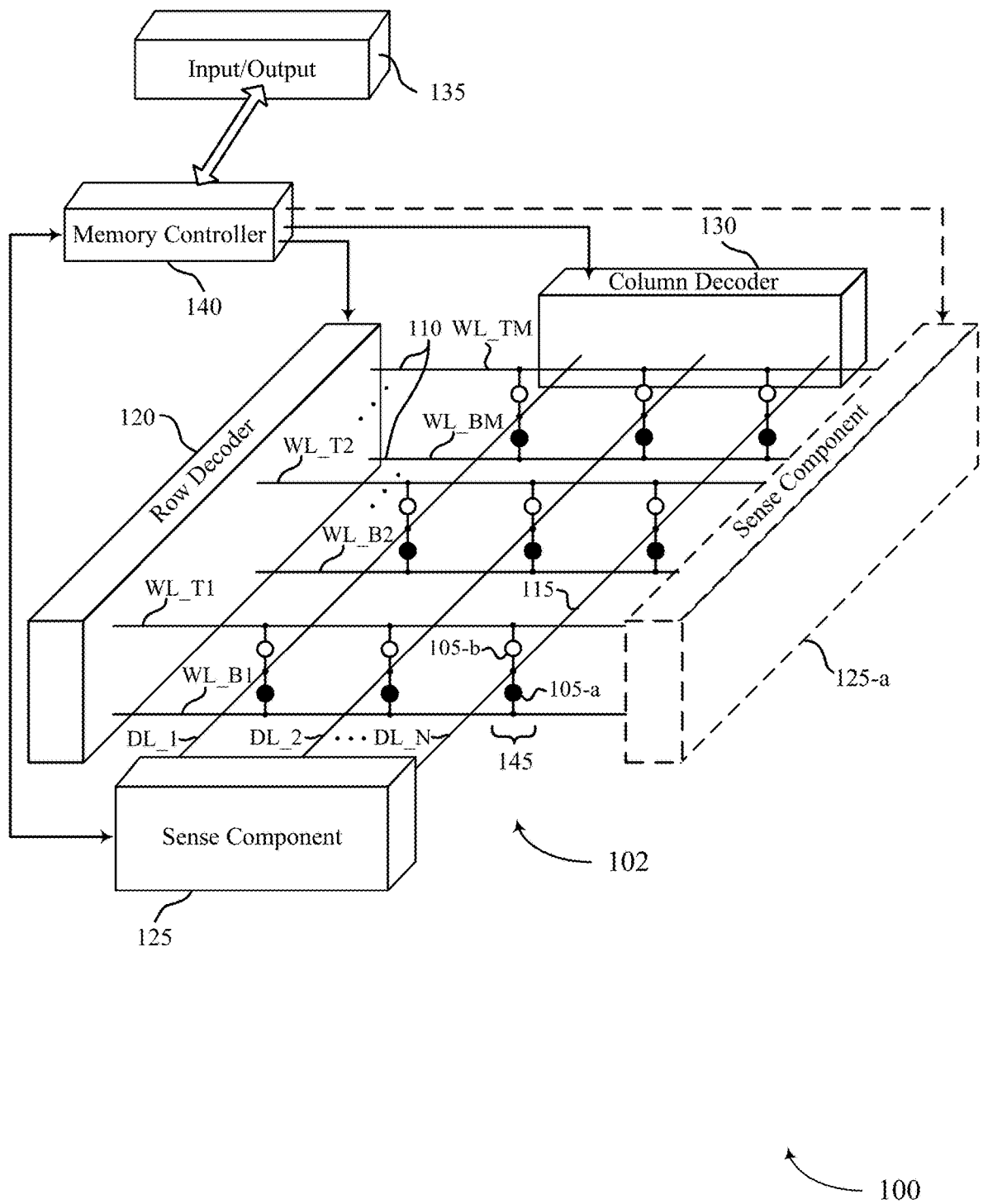
FIG. 1 illustrates an example memory device including an array of memory cells that supports a high resistivity thermal barrier in accordance with examples as disclosed herein.

A memory device may include one or more self-selecting memory cells composed of a number of components, such as cell components, arranged in a stack. The one or more cell components may be in contact with other components, such as electrodes. In some cases, the outermost electrodes may be in contact with barriers (e.g., tungsten silicon nitride (WSiN) barriers) which, in turn, may be contact with an access line (e.g., a word line or a digit line). The barriers may be configured to prevent molecular diffusion between an outermost electrode and a corresponding access line (e.g., the barriers may be examples of diffusion barriers). Additionally, the barrier may be configured to allow one or more electrical signals (e.g., a programming signal) to pass through the barrier.

Applying a signal (e.g., a programming signal or other signal) to a memory cell, however, may generate thermal energy (e.g., heat, such as latent heat) at the memory cell which may dissipate toward or onto other memory cells that are positioned in surrounding areas. The memory cell generating the thermal energy may be referred to as an aggressor cell and the memory cell onto which the thermal energy dissipates may be referred to as the victim cell in some contexts. The thermal energy may dissipate toward or onto the victim cell by (e.g., over) a thermally conductive material coupled with the memory cells, such as a digit line or a word line. When the thermal energy dissipates toward or onto the victim cell, the thermal energy may cause the victim cell to transition one or more states stored by the victim cell, which may be referred to as thermal disturb. The barrier may be configured to thermally insulate, at least partially, the memory cells from thermally conductive materials. The thermal conductivity of the barrier may depend at least in part on the density of the barrier (e.g., a higher density of WSiN may lead to a higher thermal conductivity which, in turn, may enable a greater amount of thermal disturb). In some examples, however, a barrier having a high thermal conductivity or low density may impede certain signals communicated from circuitry associated with the memory device to one or more memory cells. For example, such signals may be communicated from circuitry, through a via (e.g., a through-silicon via (TSV), an interconnect), and to an access line coupled with the memory cells. Though it may be beneficial to reduce thermal disturb between the memory cells (e.g., by using the barrier), it may also be beneficial for signals to be communicated to an access line with relatively little disturbance.

To mitigate thermal disturb and/or to stabilize the resistivity of the barrier, a low density portion of a barrier material may be formed that is configured to provide thermal insulation for a self-selecting memory cell. The low density portion may be formed by depositing the barrier material (e.g., via physical vapor deposition (PVD)) and applying a plasma treatment to the deposited barrier material. Applying the plasma to the barrier material may form the low density portion at the exposed surface of the barrier material. In some cases, as merely examples, the plasma may be created from dinitrogen and helium molecules. In cases where the barrier material is WSiN, the low density portion may also be WSiN. But the low density portion may have a greater proportion of tungsten-nitride bonds relative to the deposited barrier material. Additionally or alternatively, the low density portion may have a lower proportion of tungsten-silicon bonds relative to the deposited barrier material. These proportions may decrease the density of the treated portion, stabilize the resistivity, increase the resistivity relative to the remaining deposited barrier material, or a combination thereof, which may reduce thermal disturb of the memory cells without impeding signals from being communicated to an access line coupled with the memory cells.

Features of the disclosure are initially described in the context of a memory device. Specific examples are then described in the context of a memory array, various memory devices, a manufacturing process, and plasma application processes. These and other features of the disclosure are further illustrated by and described with reference to an apparatus diagram and flowcharts that relate to a memory device with a high resistivity thermal barrier.

FIG. 1 illustrates an example memory device 100 in accordance with examples of the present disclosure. Memory device 100 may also be referred to as an electronic memory apparatus. FIG. 1 is an illustrative representation of various components and features of the memory device 100. As such, it should be appreciated that the components and features of the memory device 100 are shown to illustrate functional interrelationships, not their actual physical positions within the memory device 100.

In the illustrative example of FIG. 1, the memory device 100 includes a three-dimensional (3D) memory array 102, although the teachings herein may also be used to form a 2D (single deck) memory array (among other device types). The 3D memory array 102 includes memory cells 105 that may be programmable to store different states. In some examples, each memory cell 105 may be programmable to store two states, denoted as a logic 0 and a logic 1. In some examples, a memory cell 105 may be configured to store more than two logic states (e.g., a multi-level cell). A memory cell 105 may, in some examples, include a self-selecting memory cell, a 3D XPoint™ memory cell, a PCM cell that includes a storage component and a selection component, a conductive-bridge RAM (CBRAM) cell, or a FeRAM cell. The memory array 102 may be positioned above a substrate that includes various circuitry, such as the row decoder 120, the sense component 125, the column decoder 130, complementary metal-oxide-semiconductor (CMOS) under the array (not shown), or the like. Although some elements included in FIG. 1 are labeled with a numeric indicator, other corresponding elements are not labeled, though they are the same or would be understood to be similar, in an effort to increase visibility and clarity of the depicted features.

The memory array 102 may include two or more two-dimensional (2D) memory arrays formed on top of one another. This may increase a number of memory cells that may be placed or created on a single die or substrate as compared with 2D arrays, which in turn may reduce production costs, or increase the performance of the memory device, or both. The memory array 102 may include two levels of memory cells 105 (e.g., memory cells 105-a and 105-b) and may thus be considered a 3D memory array; however, the number of levels is not limited to two (e.g., $2^N$ levels where N=2, 3, 4, 5 . . . ). Each level may be aligned or positioned so that memory cells 105 may be aligned (exactly, overlapping, or approximately) with one another across each level, forming a memory cell stack 145. In some cases, levels of memory cells may be referred to as decks of memory cells. In some cases, the memory cell stack 145 may include multiple self-selecting memory cells laid on top of another while sharing an access line for both. In some cases, the self-selecting memory cells may be multi-level self-selecting memory cells configured to store more than one bit of data using multi-level storage techniques.

In some examples, each row of memory cells 105 is connected to a word line 110, and each column of memory cells 105 is connected to a digit line 115. Access lines may refer to either word lines 110, digit lines 115, or both. Word lines 110 and digit lines 115 may be substantially perpendicular to one another and may create an array of memory cells. As shown in FIG. 1, the two memory cells 105 in a memory cell stack 145 may share a common conductive line such as a digit line 115. That is, a digit line 115 may be in electronic communication with the bottom electrode of the upper memory cell 105 and the top electrode of the lower memory cell 105. Other configurations may be possible, for example, a third layer may share a word line 110 with a lower layer.

In general, one memory cell 105 may be located at the intersection of two conductive lines such as a word line 110 and a digit line 115. This intersection may be referred to as a memory cell's address. A target memory cell 105 may be a memory cell 105 located at the intersection of an energized word line 110 and digit line 115; that is, word line 110 and digit line 115 may be energized to read or write a memory cell 105 at their intersection. Other memory cells 105 that are in electronic communication with (e.g., connected to) the same word line 110 or digit line 115 may be referred to as untargeted memory cells 105.

As discussed herein, electrodes may be coupled to a memory cell 105 and a word line 110 or a digit line 115. The term electrode may refer to an electrical conductor (e.g., a conductive material), and in some cases, may be employed as an electrical contact to a memory cell 105. An electrode may include a trace, wire, conductive line, conductive layer, or the like that provides a conductive path between elements or components of memory device 100. In some examples, a memory cell 105 may include one or more chalcogenide materials (e.g., germanium-antimony-tellurium (GST)) positioned between a first electrode and a second electrode. One side of the first electrode may be coupled to a word line 110 and the other side of the first electrode to one of the one or more chalcogenide materials. In addition, one side of the second electrode may be coupled to a digit line 115 and the other side of the second electrode to one of the one or more chalcogenide materials. The first electrode and the second electrode may be the same material (e.g., carbon) or different. In some cases, one or both of the word line 110 and the digit line 115 may be in contact with a first and second barrier in contact with the first electrode and the second electrode, respectively.

Operations such as reading and writing may be performed on memory cells 105 by activating or selecting word line 110 and digit line 115. In some examples, digit lines 115 may also be known as bit lines 115. Additionally or alternatively, either or both of word line 110 and digit line 115 may be referred to as an access line. References to access lines, word lines, and digit lines, or their analogues, are interchangeable without loss of understanding or operation. Activating or selecting a word line 110 or a digit line 115 may include applying a voltage to the respective line. Word lines 110 and digit lines 115 may be made of conductive materials such as metals (e.g., copper (Cu), aluminum (Al), gold (Au), tungsten (W), titanium (Ti)), metal alloys, carbon, conductively-doped semiconductors, or other conductive materials, alloys, compounds, or the like.

Accessing memory cells 105 may be controlled through a row decoder 120 and a column decoder 130. For example, a row decoder 120 may receive a row address from the memory controller 140 and activate the appropriate word line 110 based on the received row address. Similarly, a column decoder 130 may receive a column address from the memory controller 140 and activate the appropriate digit line 115. For example, memory array 102 may include multiple word lines 110, labeled WL_1 through WL_M, and multiple digit lines 115, labeled DL_1 through DL_N, where M and N depend on the array size. Thus, by activating a word line 110 and a digit line 115, e.g., WL_2 and DL_3, the memory cell 105 at their intersection may be accessed.

Upon accessing, a memory cell 105 may be read, or sensed, by sense component 125 to determine the stored state of the memory cell 105. For example, a voltage may be applied to a memory cell 105 (using the corresponding word line 110 and digit line 115) and the presence of a resulting current may depend on the applied voltage and the threshold voltage of the memory cell 105. In some cases, more than one voltage may be applied. Additionally, if an applied voltage does not result in current flow, other voltages may be applied until a current is detected by sense component 125. By assessing the voltage that resulted in current flow, the stored logic state of the memory cell 105 may be determined. In some cases, the voltage may be ramped up in magnitude until a current flow is detected. In other cases, predetermined voltages may be applied sequentially until a current is detected. Likewise, a current may be applied to a memory cell 105 and the magnitude of the voltage to create the current may depend on the electrical resistance or the threshold voltage of the memory cell 105. In some examples, sense component 125 may read information stored in a selected memory cell 105 by detecting the current flow or lack thereof through the memory cell 105.

Sense component 125 may include various transistors or amplifiers to detect and amplify a difference in the signals associated with a sensed memory cell 105, which may be referred to as latching. The detected logic state of memory cell 105 may then be output through column decoder 130 as output 135. In some cases, sense component 125 may be part of a column decoder 130 or row decoder 120. Or, sense component 125 may be connected to or in electronic communication with column decoder 130 or row decoder 120. FIG. 1 also shows an alternative option of arranging sense component 125-a (in a dashed box). An ordinary person skilled in the art would appreciate that sense component 125 may be associated either with column decoder or row decoder without losing its functional purposes.

A memory cell 105 may be set or written by similarly activating the relevant word line 110 and digit line 115 and at least one logic value may be stored in the memory cell 105. Column decoder 130 or row decoder 120 may accept data, for example input/output 135, to be written to the memory cells 105. In the case of a self-selecting memory cell including a chalcogenide material, a memory cell 105 may be written to store data by applying a programming signal to the self-selecting memory cell.

The memory controller 140 may control the operation (e.g., read, write, re-write, refresh, discharge) of memory cells 105 through the various components, for example, row decoder 120, column decoder 130, and sense component 125. In some cases, one or more of the row decoder 120, column decoder 130, and sense component 125 may be co-located with the memory controller 140. Memory controller 140 may generate row and column address signals to activate the desired word line 110 and digit line 115. Memory controller 140 may also generate and control various voltages or currents used during the operation of memory device 100.

The memory array 102 may be positioned above a substrate that includes various circuitry, such as the row decoder 120, the sense component 125, the column decoder 130, CMOS under the array (not shown), or the like. In some cases, the memory array 102 may include a high resistivity (e.g., a low density) thermal barrier that is formed based on the fabrication techniques described herein. In some examples, the density of a thermal barrier may be inversely proportional to a resistivity of a thermal barrier. For example, a plasma may be applied to a thermal barrier to increase its resistivity. The increase in resistivity may, in some examples, result in a decreased density and vice versa.

In some cases, applying a signal to a memory cell 105 may generate thermal energy. When a memory cell 105 includes a high resistivity (e.g., low density) thermal barrier material as described herein, the barrier material may be configured to thermally insulate the memory cell 105 and may prevent the generated thermal energy from dissipating onto or toward other memory cells 105 or other components. Additionally or alternatively, a barrier material having multiple sections (e.g., a first section, a second section) may prevent thermal energy from dissipating onto or toward one or more memory cells 105 while improving (e.g., facilitating, not prohibiting) the transmission of signals to an access line of the memory array 102. Stated another way, a barrier material located over an interconnect region (e.g., over a via as described with reference to FIGS. 3 through 5) may have a lower resistivity than a region located over the memory cells 105. This may allow for signals to be transmitted to various access lines (e.g., from the substrate and through the interconnect region) while allowing for the memory cells 105 to be thermally insulated.

Figure 2:
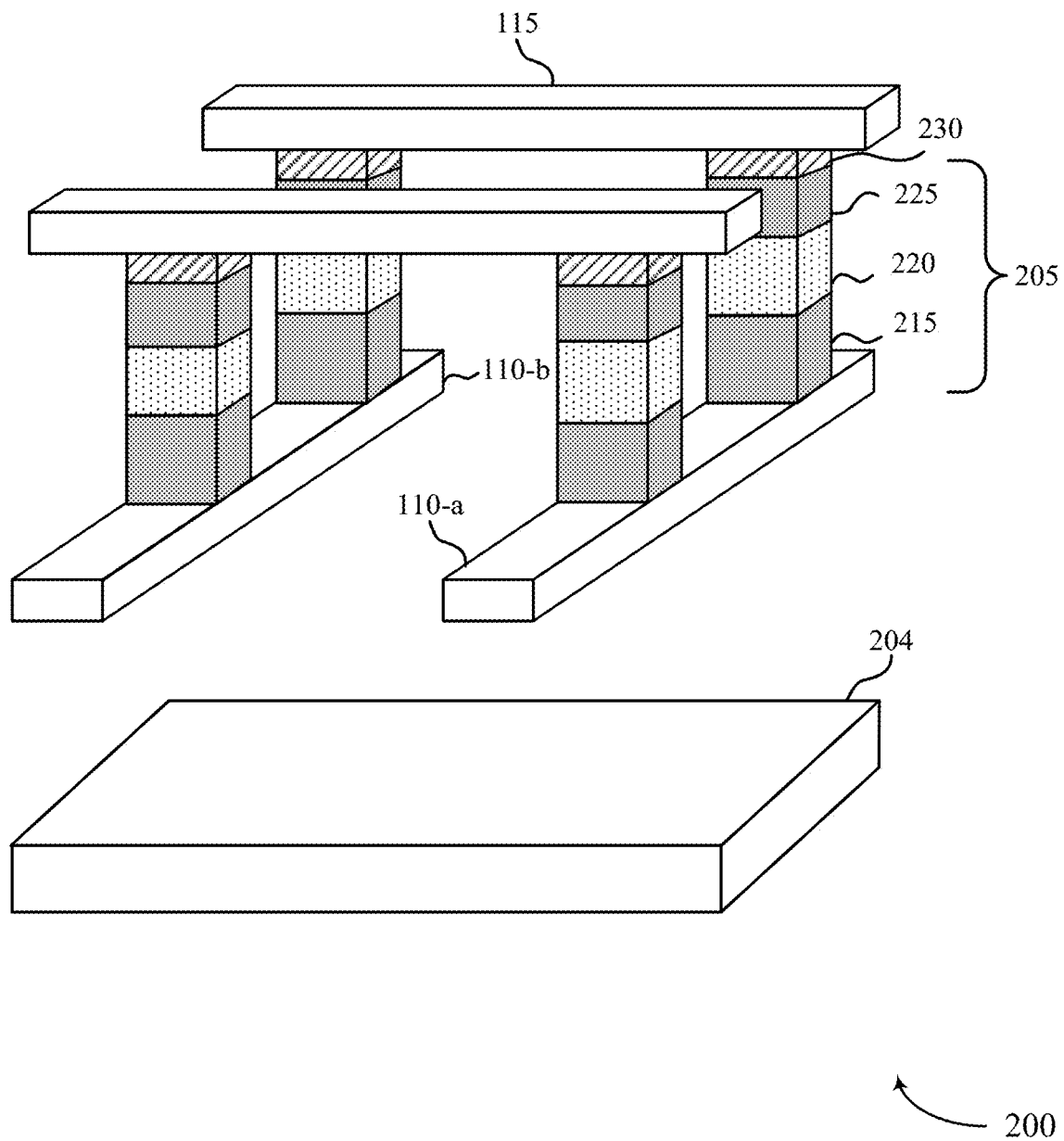
FIG. 2 illustrates an example of a memory array that supports a high resistivity thermal barrier in accordance with examples as disclosed herein.

FIG. 2 illustrates an example of a memory array 200 that supports a high resistivity thermal barrier in accordance with examples of the present disclosure. The memory array 200 may be an example of portions of memory array 102 described with reference to FIG. 1. In some examples, multiple instances of the memory array 200 may be replicated (e.g., formed and stacked on top of one another) to form a 3D memory device. The 3D memory device may include two or more decks of memory cells. The memory array 200 may include a deck 205 of memory cells (e.g., a first deck of memory cells) that is positioned above a substrate 204. In the case of a 3D memory array (not shown), the memory array 200 may include a second array or deck of memory cells on top of the first array or deck 205. The memory array 200 may also include word line 110-a, word line 110-b, and bit line 115, which may be examples of word lines 110 and a bit line 115 as described with reference to FIG. 1. In some examples, the memory array 200 may also include a barrier material 230 located between the deck of memory cells 205 and the bit line 115.

Although some elements included in FIG. 2 are labeled with a numeric indicator, other corresponding elements are not labeled, though they are the same or would be understood to be similar, in an effort to increase the visibility and clarity of the depicted features.

In some cases, memory cells of the deck 205 may each include first electrode 215, chalcogenide material 220, and second electrode 225. In some examples, the deck 205 may include multiple cell components that may be separated by a third electrode (not shown). Additionally or alternatively, the deck 205 may include one or more barrier materials. As used herein, materials included in a cell stack between a word line 110 and a bit line 115 may be considered as included in a memory cell and referred to collectively or individually as memory cell material. For example, as described below with reference to FIGS. 3 through 5, a memory cell material (e.g., a material of a memory cell 305 as described with reference to FIG. 3) may be understood as a composite (heterogenous, mixed, amalgamated) material and may include distinct materials included in a first electrode 215, a chalcogenide material 220, and/or a second electrode 225. In some cases, a combination of various materials (e.g., first electrode 215, chalcogenide material 220, second electrode 225) that may form a memory cell (e.g., memory cell 105-a, memory cell 105-b) may also be collectively referred to as a memory cell stack. As shown in FIG. 2, the memory cell stack 205 may be coupled with a barrier material 230 that is located between the memory cell stack 205 and the bit line 115.

In some cases, a barrier material 230 may provide thermal insulation between an access line (e.g., a digit line 115) and an electrode 225. In other examples, a barrier material 230 may be located between the word line (e.g., word line 110-a) and the electrode 215 (not shown). In yet another example, a barrier material may be located both between an access line (e.g., a digit line 115) and an electrode 225 and also between the word line (e.g., word line 110-a) and the electrode 215 (e.g., there may be two barrier materials 230 associated with one or more pillars of the memory array 200). Accordingly, one or more pillars of the memory array 200 may include a barrier material, an electrode (e.g., a bottom electrode), a selector device, an electrode (e.g., a middle electrode), a memory cell, an electrode (e.g., a top electrode), and a barrier material. The thermal insulation may, for instance, be provided by a low density barrier material (e.g., a high resistivity barrier material). In one case, if a programming signal is applied to the memory cell 205 and the barrier material 230 is thermally-insulating, the electrode 225 may still conduct the generated thermal energy. However, the barrier material 230 may mitigate the amount of thermal energy passed to word line 110-a. Additionally or alternatively, the resistivity of the barrier material 230 may fluctuate by a factor (e.g., 2 or 3 times) as a corresponding cell component generates thermal energy.

For instance, memory cell 205 may receive a programming signal from digit line 115. As the memory cell 205 receives the programming signal, it may generate thermal energy. The memory cell 205 may impart the thermal energy to the barrier material 230, which may cause its resistivity to changes (e.g., rise). After receiving the programming signal, the memory cell 205 may release thermal energy (e.g., the memory cell 205 may cool down). While the memory cell 205 releases thermal energy, the barrier material 230 may also release thermal energy. As the barrier material 230 releases thermal energy, its resistivity may decrease. However, the trajectory that the resistivity of the barrier material 230 follows as it releases thermal energy may not match the trajectory that the resistivity of the barrier material 230 follows as it generates thermal energy. Such fluctuations may enable a shift in $V_T$, $I_{reset}$, or amount of read disturb.

In some examples, access lines (e.g., word line 110, bit line 115) may include an electrode layer (e.g., a conformal layer), in lieu of electrodes 215 or 225 and thus may comprise multi-layered access lines. In such examples, the electrode layer of the access lines may interface with a memory material (e.g., chalcogenide material 220). In some examples, access lines (e.g., word line 110, bit line 115) may directly interface with a memory material (e.g., chalcogenide material 220) without an electrode layer or an electrode in-between.

The memory cells of the deck 205 may, in some examples, have common conductive lines such that corresponding pillars may share bit lines 115 or word lines 110. For example, the electrode 225 and a top electrode of an adjacent pillar may both be coupled to bit line 115 such that bit line 115 is shared by adjacent memory cells (e.g., horizontally aligned).

In some examples, the memory array 200 may include an additional deck or additional decks of memory cells stacked on the deck 205. Each additional deck of memory cells may be aligned (e.g., vertically aligned) and may include an additional bit line. For example, an additional deck of memory cells may be coupled with the deck 205 such that a bottom electrode is coupled with the bit line 115 and a top electrode is coupled with the additional bit line. The additional bit line may be electrically isolated from the bit line 115 (e.g., an insulating material may be interposed between the additional bit line and the bit line 115). As a result, the first deck 205 and each additional deck may be separated and may operate independently of each other. In some cases, an access line (e.g., either word line 110 or bit line 115) may include a selection component (e.g., a two-terminal selector device, which may be configured as one or more thin-film materials integrated with the access line) for a respective memory cell at each cross-point. As such, the access line and the selection component may together form a composite layer of materials functioning as both an access line and a selection component.

The architecture of the memory array 200 may in some cases be referred to as an example of a cross-point architecture, as a memory cell may be formed at a topological cross-point between a word line 110 and a bit line 115 as illustrated in FIG. 2. Such a cross-point architecture may offer relatively high-density data storage with lower production costs compared to some other memory architectures. For example, a memory array with a cross-point architecture may have memory cells with a reduced area and, resultantly, may support an increased memory cell density compared to some other architectures. For example, a cross-point architecture may have a $4F^2$ memory cell area, where F is the smallest feature size (e.g., a minimum feature size), compared to other architectures with a $6F^2$ memory cell area, such as those with a three-terminal selection component. For example, a DRAM memory array may use a transistor (e.g., a thin-film transistor), which is a three-terminal device, as the selection component for each memory cell, and thus a DRAM memory array comprising a given number of memory cells may have a larger memory cell area compared to a memory array with a cross-point architecture comprising the same number of memory cells.

While the example of FIG. 2 shows one deck 205, other configurations may include any number of decks (e.g., 2 decks, 4 decks, 8 decks, 16 decks, 32 decks, or a greater number of decks). In some examples, one or more of the decks may include self-selecting memory cells that include chalcogenide material 220. In other examples, one or more of the decks may include FeRAM cells that include a ferroelectric material. In yet another examples, one or more of the decks may include a PCM cell that includes a storage component and a selection component. Chalcogenide materials 220 may, for example, include a chalcogenide glass such as, for example, an alloy of selenium (Se), tellurium (Te), arsenic (As), antimony (Sb), carbon (C), germanium (Ge), and silicon (Si). In some example, a chalcogenide material having primarily selenium (Se), arsenic (As), and germanium (Ge) may be referred to as SAG-alloy. In some examples, SAG-alloy may include silicon (Si) and such chalcogenide material may be referred to as SiSAG-alloy. In some examples, the chalcogenide glass may include additional elements such as hydrogen (H), oxygen (O), nitrogen (N), chlorine (Cl), gallium (Ga), or fluorine (F), which may each be in atomic or molecular forms.

In some cases, a deck (e.g., the deck 205) of a memory device may be formed using the fabrication techniques described herein. For example, the memory array 200 may be formed using one or more fabrication techniques as described with reference to FIGS. 3 through 7. In some examples, the substrate 204 may include various circuitry, such as CMOS under the array (not shown). The CMOS under the array may, in some cases, be configured to communicate with the memory array 200 (e.g., it may be configured to transmit signaling to the memory cell 205) through a via located in the array's peripheral region. For example, the via may allow for signaling to be transmitted from the CMOS to an access line (e.g., to bit line 115). The fabrication techniques described herein may result in the formation of a high resistivity thermal barrier having multiple sections (e.g., a first section, a second section). The sections of the barrier may be treated such that a section over the memory array 200 may prevent thermal energy from dissipating onto one or more memory cells 205, and the region over the via may allow for signals to be transmitted to various access lines (e.g., the section over the via may have a relatively lower thermal resistivity).

Figure 3:
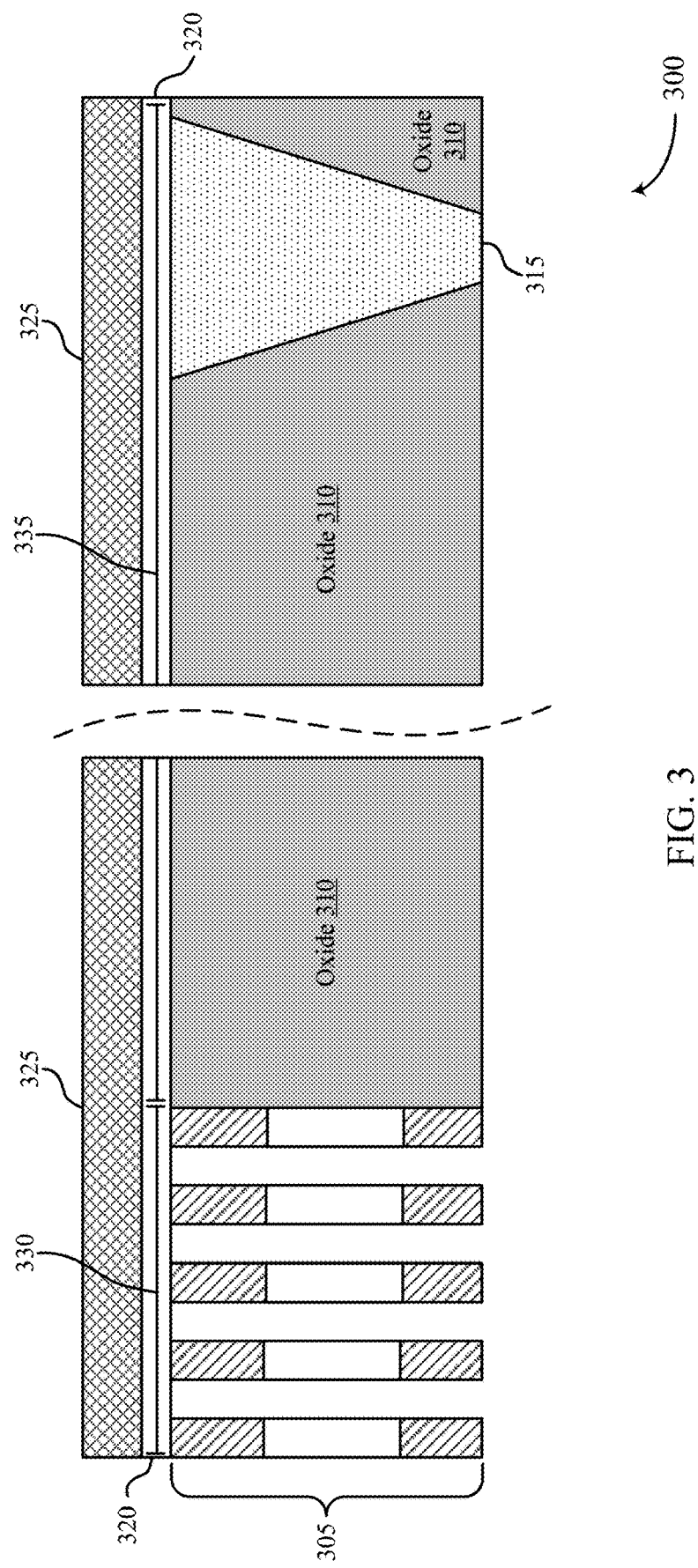
FIGS. 3 through 5 illustrate examples of a memory device with a high resistivity thermal barrier in accordance with examples as disclosed herein.

FIG. 3 illustrates an example of a memory device 300 that supports a high resistivity thermal barrier in accordance with examples of the present disclosure. In some examples, memory device 300 may include one or more memory cells 305 located above a substrate (not shown), which may be an example of the deck of memory cells 205 as described with reference to FIG. 2. The memory device 300 may include an oxide region 310 and one or more vias 315. In some examples, the via 315 may extend through a portion of the oxide region 310 (e.g., the oxide region 310 may be located on two sides of the via 315). Additionally or alternatively, the memory device 300 may include a barrier material 320 and an access line 325. In some examples, the barrier material 320 may be located above the memory cells 305, the oxide region 310, and/or the via 315 and the access line 325 may be located above the barrier material 320.

In some examples, the memory cells 305 may be included in or referred to as pillars. For example, each pillar may include a memory cell and one or more electrodes. In some examples, each memory cell may be or may be referred to as a self-selecting memory cell 305. A self-selecting memory cell 305 may include one or more cell components that may be programmed to a logic state by applying a programming signal to the respective memory cell 305. Providing programming signals to the memory cell 305 may store data (e.g., one or more logic values at a cell component of the memory cell 305). For instance, if the cell component receives a programming signal of a first polarity, the memory cell 305 may store a logic '0' and if the cell component receives a programming signal of a second polarity, the memory cell 305 may store a logic '1'.

Additionally or alternatively, each memory cell 305 may include a memory cell material that may be understood as a composite (heterogenous, mixed, amalgamated) material and may include distinct materials included in an electrode and/or chalcogenide material. In some examples, the memory cell material may include one or more electrodes (e.g., electrode 215 and electrode 225 as described with reference to FIG. 2) and a chalcogenide material (e.g., chalcogenide material 220 as described with reference to FIG. 2). Thus, in some examples, the memory cells 305 may be understood to include volatile and/or non-volatile memory cells.

In some examples, the memory device 300 may include an oxide region 310. The oxide region 310 may be located adjacent to one of the memory cells 305. That is, the oxide region 310 may, in some examples, be in contact with, be next to, and/or be separate from at least one of the pillars of memory cells 305. In some examples, a dielectric material may be located between each of the memory cells 305, and the oxide region 310 may be in contact with at least one of the memory cells 305. In some examples, the dielectric material between each of the memory cells 305 may be or may include an oxide material (e.g., an oxide material deposited in the oxide region 310). In some examples, the oxide region 310 may be formed (e.g., deposited) on a substrate. Various processing techniques may be performed—e.g., a top surface of the oxide region 310 may be polished—before the memory cells 305 are formed. For example, the top surface of the oxide region 310 may be removed using a polishing technique, such as a chemical-mechanical planarization (CMP) processing step. A portion of the oxide region 310 may be subsequently removed (e.g., it may be etched) to form a region in which the memory cells 305 are formed. Thus by removing a portion of the oxide region 310, at least one memory cell 305 may be adjacent to (e.g., in contact with) the oxide region 310.

In some examples, the oxide region 310 may be or may include a dielectric material. As discussed herein, one or more vias 315 may extend through the oxide region 310 and may communicate signaling to one or more components, such as memory cells 305. Accordingly, the oxide region 310 (e.g., a dielectric material) may insulate the memory cells 305 from the via 315. That is, the oxide region 310 may prevent electrical and/or thermal disturbance that may otherwise occur between the memory cells 305 and the via 315. In some instances, the oxide region 310 may include multiple vias 315, and each via 315 may be separated by a portion of the oxide region 310. Stated another way, the oxide region 310 may insulate one or more vias 315 from each other and/or each of the memory cells 305. In some examples, each via 315 may extend through the oxide region 310 (e.g., to a substrate below the oxide region 310). In some examples, the oxide region 310 may be located on (e.g., adjacent to, in contact with) each side of the via 315.

As discussed herein, the oxide region 310 may include one or more vias 315. The vias 315, which may be or may be referred to as through-silicon vias (TSVs) or interconnects, may communicate signaling from a substrate of the memory device 300 to one or more memory cells. For example, the signaling may be communicated to the access line 325 and may be associated with an access operation (e.g., a read operation, a write operation) of one or more memory cells 305. In some examples, the vias 315 may formed using a fabrication process—such as an etching process—to remove a portion of the oxide region 310. Stated another way, a portion of the oxide region 310 may be removed, and a via 315 may be formed therein. Thus, in some examples, the oxide region 310 may be located on both sides of the via 315 (or on both sides of each via 315).

In some examples, a barrier material 320 may be deposited over the memory cells 305, the oxide region 310, and/or the via 315 (or each via 315 in the case of multiple vias). The barrier material 320 may be composed of tungsten silicon nitride (WSiN). In some examples, an untreated barrier material 320 (e.g., the barrier material 320 prior to one or more processing techniques such as applying a plasma) may be deposited to improve reset current benefit (e.g., more consistent values of $I_{reset}$, $V_T$, and read disturb may be applied to the memory cells 305). However, applying a signal to a memory cell 305 may generate thermal energy (e.g., heat, such as latent heat) at the memory cell 305. The heat may ordinarily dissipate onto other memory cells 305 that are positioned in surrounding areas. The thermal energy may dissipate onto the victim cell over a thermally conductive material coupled with the memory cells, such as a digit line or a word line. Thus, a barrier capable of thermally insulating one or more memory cells 305 may be beneficial.

As discussed herein, various techniques may be used to change one or more properties associated with the barrier material 320. For example one or more techniques or processing steps may be used to alter a density or a resistivity of at least part of a barrier material 320. As one non-limiting example, a plasma may be applied to at least a portion of the barrier material 320. In some examples, treating the barrier material 320 may mitigate (e.g., prevent) such thermal energy from disturbing other components, such as memory cells 305 in the array. In some examples, increasing the thermal resistivity (e.g., decreasing the density) of the barrier material 320 (e.g., by applying a plasma) may result in signaling communicated between the via 315 and the access line 325 being impeded. Accordingly, by treating a portion (e.g., a section) of the barrier material 320 (e.g., with a plasma), the barrier material 320 may thermally insulate one or more memory cells 305 and allow for signaling to be communicated through the via (e.g., from the substrate) to the access line 325.

In some examples, the barrier material 320 may include a first section 330 and a second section 335. The first section 330 may be located above at least the memory cells 305 and the second section 335 may be located above the oxide region 310 and/or the via 315 (e.g., which may be above the remaining portion of the memory device 300). To increase the thermal resistivity or lower the density of the first section 330 of the barrier material 320, the second section 335 may be masked (e.g., a portion of the barrier material 320 may be at least partially masked). Stated another way, a plasma may be applied to the first section 330 and not the second section 335, which may result in a local application of plasma. The plasma may be applied to a top portion of the first section 330. Accordingly, a bottom portion of the first section 330 (e.g., below the first section) may not receive the plasma treatment. This may result in the top portion (e.g., the top layer) having a different density (e.g., a different, higher resistivity) than the bottom portion of the first section 330. In some examples, applying the plasma to the first section 330 of the barrier material 320, dinitrogen may exist on an upper surface or within an upper layer of the first section 330.

In some examples, a type of plasma treatment may be selected. For example, the treatment may be selected based on different times of treatment, different deposition chamber temperature functions, different deposition chamber pressure functions, different amounts of constituent molecules (e.g., dinitrogen or helium) used up to make the plasma of the plasma treatment, different plasma powers, or a combination thereof. In some examples, the plasma may be made from a gas composed of dinitrogen and helium molecules. The plasma may be applied for anywhere within a range of time durations (e.g., 50 seconds to 100 seconds). A lower-bound of the range of time durations may range between 46 seconds and 54 seconds, 47 seconds and 53 seconds, 48 seconds and 52 seconds, 49 seconds and 51 seconds, or may be about 50 seconds. An upper-bound of the range of time durations may range between 96 seconds and 104 seconds, 97 seconds and 103 seconds, 98 seconds and 102 seconds, 99 seconds and 101 seconds, or may be about 100 seconds. Additionally, the plasma treatment may be associated with a power anywhere within a range of power values of 1 kW and 2 kW. A lower-bound power of the range of power values may range between 0.6 kilowatts (kW) and 1.4 kW, 0.7 kW and 1.3 kW, 0.8 kW and 1.2 kW, 0.9 kW and 1.1 kW, or may be about 1.0 kW. An upper-bound power of the range of power values may range between 1.6 kW and 2.4 kW, 1.7 kW and 2.3 kW, 1.8 kW and 2.2 kW, 1.9 kW and 2.1 kW, or may be about 2.0 kW.

By applying the plasma to the first section 330, the density of the first section 330 may be decreased and the resistivity may be altered. Lowering the density of the first section 330 may, in some examples, result in an increased resistivity of the first section 330. Additionally or alternatively, the density of the second section 335 may remain relatively higher than the first section 330. For example, the density of the first section 330 may decrease from approximately 6.756 grams per cubic centimeters (g/cc) to a density of 3.7 g/cc. Because a reduced density of the barrier material 320 may result in an increased thermal resistivity, applying the plasma to the first section 330 of the barrier material 320 may result in the section over the memory cells 305 having an increased thermal resistivity compared to the section over the via 315. Such treatment may result in the barrier material 320 thermally insulating one or more memory cells 305 while allowing for signaling to be communicated through the via (from the substrate) to the access line 325.

In some cases, the low density portion of the barrier material (e.g., the first section 330) may include a bilayer structure. In one example (e.g., when utilizing a low density barrier material), a first layer of the bilayer structure (e.g., a surface layer in contact with access line 325) may be richer (e.g., denser) in tungsten than a second layer of the bilayer structure (e.g., a bulk layer in contact with the memory cells 305). In another example (e.g., when utilizing low density barrier material), a first layer of the bilayer structure (e.g., a surface layer in contact electrode memory cells 305) may be richer (e.g., denser) in tungsten than a second layer of the bilayer structure (e.g., a bulk layer in contact with access line 325). In either example, the first layer may have a thickness that is different than (e.g., thinner than) the second layer. The bilayer structure may have an overall density less than the second section 335 of the barrier material barrier 320. Additionally or alternatively, the barrier material may include a trilayer structure. In one example, the trilayer structure may include a first layer that may be richer (e.g., denser) in tungsten than a second layer (e.g., a middle layer) of the trilayer structure. In some examples, the third layer may be or may be associated with the original density (i.e., the third layer may have the same density as the untreated barrier material 320).

Figure 4:
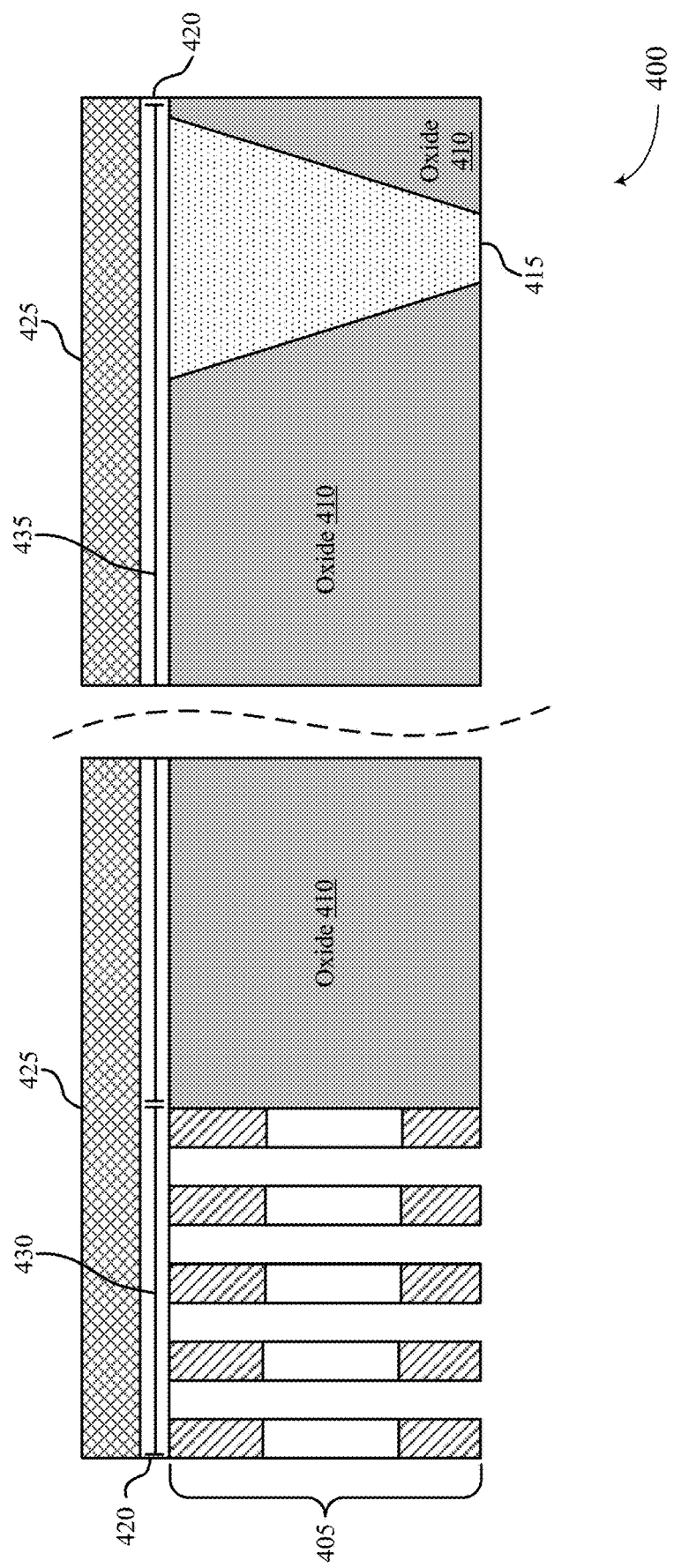

FIG. 4 illustrates an example of a memory device 400 that supports a high resistivity thermal barrier in accordance with examples of the present disclosure. In some examples, memory device 400 may include one or more memory cells 405 located above a substrate (not shown), which may be an example of the 305 as described with reference to FIG. 3. The memory device 400 may include an oxide region 410 and one or more vias 415, which may be an example of the oxide region 310 and the vias 315 as described with reference to FIG. 3. In some examples, the memory device 400 may include a barrier material 420 and an access line 425. The barrier material 420 may be located above the memory cells 405, the oxide region 410, and/or the via 415 and the access line 425 may be located above the barrier material 420.

In some examples, the memory device 400 may include an oxide region 410 that may be located adjacent to (e.g., in contact with) one of the memory cells 405. In some examples, the oxide region 410 may be in contact with the memory cells 405, may be next to (e.g., adjacent to) the memory cells 405, and/or may be separate from the memory cells 405. The oxide region 410 may be or may include a dielectric material, which may insulate the memory cells 405 from one or more vias 415 extending through the oxide region 410. That is, the oxide region 410 may prevent electrical and/or thermal disturbance that may otherwise occur between the memory cells 405 and signaling communicated by the via 410 (e.g., from the substrate to the access line 425). In some instances, the oxide region 410 may include multiple vias 415, and each via 415 may be separated by a portion of the oxide region 410. Each via 415 may extend through the oxide region 410 (e.g., to a substrate below the oxide region 410). In some examples, the oxide region 410 may be located on (e.g., adjacent to, in contact with) each side of the via 415.

As discussed herein, the oxide region 410 may include one or more vias 415. The vias 415, which may be or may be referred to as through-silicon vias (TSVs) or interconnects, may communicate signaling from a substrate of the memory device 400 to one or more components, such as memory cells 405. A barrier material 420 may be deposited over the memory cells 405, the oxide region 410, and/or the via 415 (or each via 415 in the case of multiple vias), which may improve reset current benefit (e.g., more consistent values of $I_{reset}$, $V_T$, and read disturb may be applied to the memory cells 405). In some instances, it may be beneficial for the barrier material 420 to thermally insulate one or more memory cells 405.

A plasma may be applied to at least a portion (e.g., a section) of the barrier material 420 to improve the thermal resistivity of the respective section. In some examples, the plasma may be applied directly over each of the memory cells 405. That is, when applying the plasma directly over each of the memory cells, the barrier material 420 directly above each memory cell 405 may be treated (i.e., it may possess a different density than other portions of the barrier material 420), while the barrier material that is not located directly above each memory cell 405 may possess a different density than the treated portion. In some examples, the plasma may be applied directly over each of the memory cells 405 using one or more patterning techniques that result in plasma being applied directly over each memory cell 405. Various techniques may be used to change one or more properties associated with the barrier material 420. For example, one or more techniques or processing steps may be used to alter a density or a resistivity of at least a part of the barrier material 420. In some examples, treating the barrier material 420 may mitigate (e.g., prevent) such thermal energy from disturbing other memory cells 405 in the array. However, it may be beneficial for the barrier material 420 above the via 415 to not impede signaling communicated to the access line 425. Accordingly, by treating a portion (e.g., a section) of the barrier material 420 with a plasma, the barrier material 420 may thermally insulate one or more memory cells 405 and allow for signaling to be communicated through the via (from the substrate) to the access line 425.

In some examples, the barrier material 420 may include a first section 430 and a second section 435. The first section 430 may be located above at least the memory cells 405 and the second section 435 may be located above the oxide region 410 and/or the via 415 (e.g., which may be above the remaining portion of the memory device 400). As described herein, it may be desirable for the first section 430 of the barrier material 420 (e.g., above the memory cells 405) to have a high thermal resistivity (e.g., a low density) and for the second section 435 (e.g., above at least the via 415) to have a relatively lower thermal resistivity (e.g., a relatively higher density).

Accordingly, the untreated barrier material 420 as shown in FIG. 4 may be selected based on its resistivity. For example, the untreated barrier material 420 (e.g., the barrier material 420 prior to one or more processing techniques such as applying a plasma) may have a relatively low resistivity such that it may be desirable to increase the resistivity of the first section 430 (or to lower the density of the first section 430). In some examples, the untreated barrier material 420 may have a higher density (e.g., a lower resistivity) than the untreated barrier material 320 as shown in and discussed with reference to FIG. 3. Accordingly, a target density (e.g., a target resistivity) of the first section 430 may be determined, and, as one example of a processing technique to change density and/or resistivity) a plasma may be applied to the first section 430. The difference between the treated and untreated portions of the barrier material 420 may be a same or similar difference as between the treated and untreated portions of the barrier material 320 as described with reference to FIG. 3. That is, the barrier material 320 may be associated with a first resistivity and the difference in resistivity between the treated portion and the untreated portion of the barrier material 320 may be represented by $\Delta$. With respect to FIG. 4, the barrier material 420 may be associated with a second resistivity that is lower than the first resistivity (e.g., of the barrier material 320). The target density (e.g., the target resistivity) of a portion of the barrier material 420 may be determined and, in some examples, a plasma may be applied such that the difference in resistivity between the treated portion and the untreated portion of the barrier material 420 may be represented by $\Delta 1$. In some examples, $\Delta$ and $\Delta 1$ may be a same or similar value).

As discussed herein, the plasma treatment may be applied to the first section 430 to replicate the desired resistivity—i.e., the plasma treatment may increase the thermal resistivity of the first section 430 while the resistivity of the second section 435 is maintained relatively low. Increasing the resistivity of the first section 430 may, in some examples, result in a lowered density of the first section 430. Additionally or alternatively, the density of the second section 435 may remain relatively higher than the first section 430. In some examples, the plasma treatment may result in the barrier material 420 thermally insulating one or more memory cells 405 while allowing for signaling to be communicated through the via (from the substrate) to the access line 425.

In some cases, the low density portion of the barrier material (e.g., the first section 430) may include a bilayer structure. In one example (e.g., when utilizing a low density barrier material), an upper layer of the bilayer structure (e.g., a surface layer in contact with access line 425) may be richer (e.g., denser) in tungsten than a lower layer of the bilayer structure (e.g., a bulk layer in contact with the memory cells 405). In another example (e.g., when utilizing low density barrier material), a lower layer of the bilayer structure (e.g., a surface layer in contact electrode memory cells 405) may be richer (e.g., denser) in tungsten than an upper layer of the bilayer structure (e.g., a bulk layer in contact with access line 425). In either example, one layer (e.g., the upper layer or the lower layer) may have a thickness that is different than (e.g., thinner than) the other layer. The bilayer structure may have an overall density less than the second section 435 of the barrier material barrier 420. Additionally or alternatively, the barrier material may include a trilayer structure. In one example, the trilayer structure may include an upper layer that may be richer (e.g., denser) in tungsten than a middle layer of the trilayer structure. In some examples, the lower layer may be or may be associated with the original density (i.e., the third layer may have the same density as the untreated barrier material 320). In another example, the trilayer structure may include a lower layer that may be richer (e.g., denser) in tungsten than a middle layer of the trilayer structure. In some examples, the upper layer may be or may be associated with the original density (i.e., the third layer may have the same density as the untreated barrier material 420).

Figure 5:
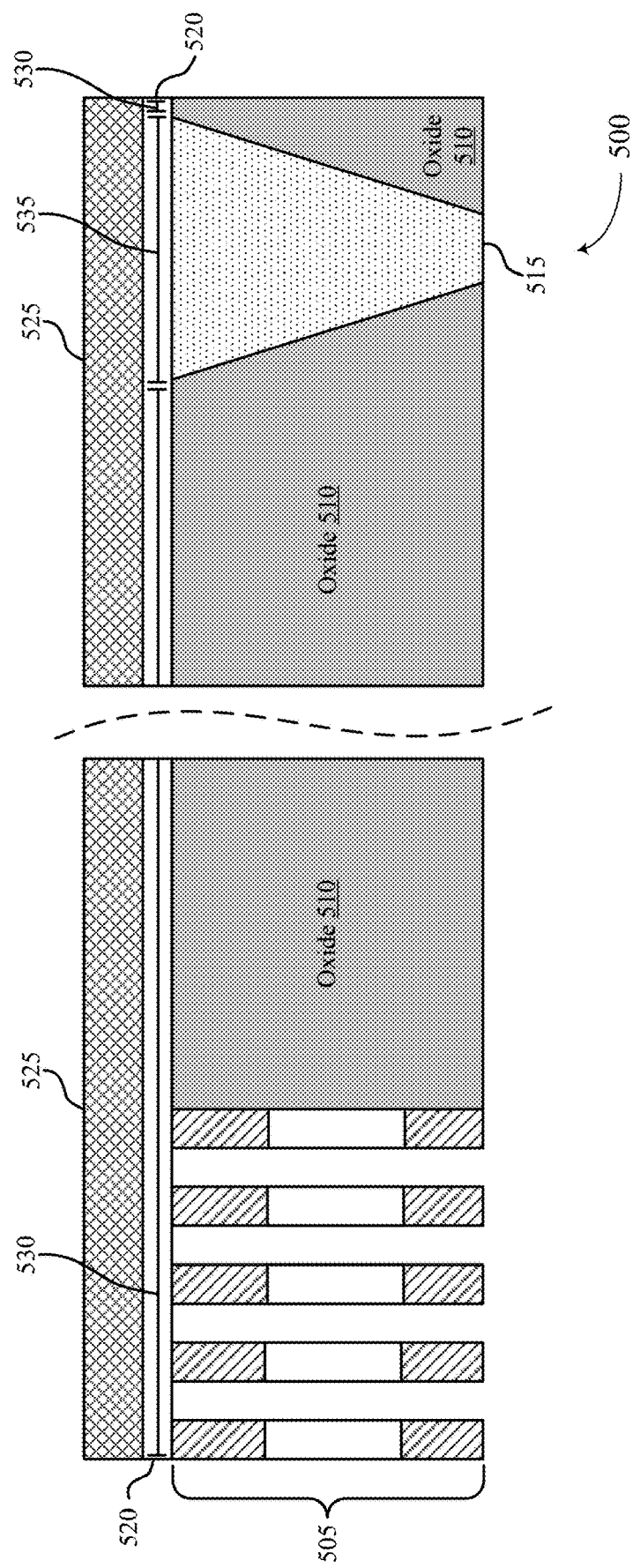

FIG. 5 illustrates an example of a memory device 500 that supports a high resistivity thermal barrier in accordance with examples of the present disclosure. In some examples, memory device 500 may include one or more memory cells 505 located above a substrate (not shown), which may be an example of the 305 as described with reference to FIG. 3. The memory device 500 may include an oxide region 510 and one or more vias 515, which may be an example of the oxide region 310 and the vias 315 as described with reference to FIG. 3. In some examples, the memory device 500 may include a barrier material 520 and an access line 525. The barrier material 520 may be located above the memory cells 505, the oxide region 510, and/or the via 515 and the access line 525 may be located above the barrier material 520.

In some examples, the memory device 505 may include an oxide region 510 that may be located adjacent to (e.g., in contact with) one of the memory cells 505. The oxide region 510 may be or may include a dielectric material, which may insulate the memory cells 505 from one or more vias 515 extending through the oxide region 510. That is, the oxide region 510 may prevent electrical and/or thermal disturbance that may otherwise occur between the memory cells 505 and signaling communicated by the via 510 (e.g., from the substrate to the access line 525). In some instances, the oxide region 510 may include multiple vias 515, and each via 515 may be separated by a portion of the oxide region 510. Each via 515 may extend through the oxide region 510 (e.g., to a substrate below the oxide region 510). In some examples, the oxide region 510 may be located on (e.g., adjacent to, in contact with) each side of the via 515.

As discussed herein, the oxide region 510 may include one or more vias 515. The vias 515, which may be or may be referred to as through-silicon vias (TSVs) or interconnects, may communicate signaling from a substrate of the memory device 500 to one or more components, such as memory cells 505. A barrier material 520 may be deposited over the memory cells 505, the oxide region 510, and/or the via 515 (or each via 515 in the case of multiple vias), which may improve reset current benefit (e.g., more consistent values of $I_{reset}$, $V_T$, and read disturb may be applied to the memory cells 505). In some instances, it may be beneficial for the barrier material 520 to thermally insulate one or more memory cells 505.

A plasma may be applied to at least a portion (e.g., a section) of the barrier material 520 to improve the thermal resistivity of the respective section. Various techniques may be used to change one or more properties associated with the barrier material 520. For example, one or more techniques or processing steps may be used to alter a density or a resistivity of at least a part of the barrier material 520. In some examples, treating the barrier material 520 may mitigate (e.g., prevent) such thermal energy from disturbing other memory cells 505 in the array. However, it may be beneficial for the barrier material 520 above the via 515 to not impede signaling communicated to the access line 525. Accordingly, by treating a portion (e.g., a section) of the barrier material 520 with a plasma, the barrier material 520 may thermally insulate one or more memory cells 505 and allow for signaling to be communicated through the via (from the substrate) to the access line 525.

As described herein, the barrier material 520 may include a first section 530 and a second section 535. The first section 530 may be located above all portions of the memory device 500 other than the via 515. Stated another way, the second section 535 may be located directly above the via 515 (e.g., located above a top surface of the via 515, located only above and in the vertical space directly above/overlying the via). In some examples, the second section 535 may be masked using a reverse polarity chop or by utilizing the reticle of the via 515 related to other manufacturing techniques that may be associated with creating one or more components otherwise shown in FIG. 5. For example, one or more processing techniques may be employed to deposit the oxide region 510, form the memory cells 505, and form the via(s) 515 that extend through the oxide region 510. The via 515 may be formed by masking the oxide region 510 and/or the memory cells 505 and subsequently etching through at least the oxide region 510 (e.g., etching through the oxide region 510 to the substrate). Thus, as described with reference to FIG. 5, the processing steps used to form one or more portions of the memory device 500 may be leveraged to treat the barrier material 520.

For example, a plasma may be applied to the first section 530 of the barrier material 320 to increase the resistivity of the first section 530 (e.g., to lower the density of the first section 530). The plasma may be applied after the second section 535 has been masked. As described above, the previous masking processes (e.g., used to form the via 515) may be leveraged to apply the plasma to the first section 530. In some examples, leveraging such prior processes may improve the time needed to produce the memory device 500 and/or reduce costs associated with its production.

In some examples, applying the plasma to the first section 530 may decrease the density of the first section 530 from approximately 6.756 grams per cubic centimeters (g/cc) to a density of 3.7 g/cc. Because a reduced density of the barrier material 520 may result in an increased thermal resistivity, applying the plasma to the first section 530 of the barrier material 520 may result in the section over the memory cells 505 having an increased thermal resistivity relative to the remaining portion of the barrier material 520. Stated another way, applying the plasma to the portion of the barrier material 520 that is not located over the via 515 may prevent an impedance in signaling communicated from the via 515 to the access line 525. In some examples, masking the area directly above the via (e.g., the second section 535) may utilize existing processing steps (e.g., masking processes) that were used to form the via 515. This may result in reduced processing time and reduced processing costs when forming the memory device 500.

In some cases, the low density portion of the barrier material (e.g., the first section 530) may include a bilayer structure. In one example (e.g., when utilizing a low density barrier material), an upper layer of the bilayer structure (e.g., a surface layer in contact with access line 525) may be richer (e.g., denser) in tungsten than a lower layer of the bilayer structure (e.g., a bulk layer in contact with the memory cells 505). In another example (e.g., when utilizing low density barrier material), a lower layer of the bilayer structure (e.g., a surface layer in contact electrode memory cells 505) may be richer (e.g., denser) in tungsten than an upper layer of the bilayer structure (e.g., a bulk layer in contact with access line 525). In either example, one layer (e.g., the upper layer or the lower layer) may have a thickness that is different than (e.g., thinner than) the other layer. The bilayer structure may have an overall density less than the second section 535 of the barrier material barrier 520. Additionally or alternatively, the barrier material may include a trilayer structure. In one example, the trilayer structure may include an upper layer that may be richer (e.g., denser) in tungsten than a middle layer of the trilayer structure. In some examples, the lower layer may be or may be associated with the original density (i.e., the third layer may have the same density as the untreated barrier material 320). In another example, the trilayer structure may include a lower layer that may be richer (e.g., denser) in tungsten than a middle layer of the trilayer structure. In some examples, the upper layer may be or may be associated with the original density (i.e., the third layer may have the same density as the untreated barrier material 520).

Figure 6:
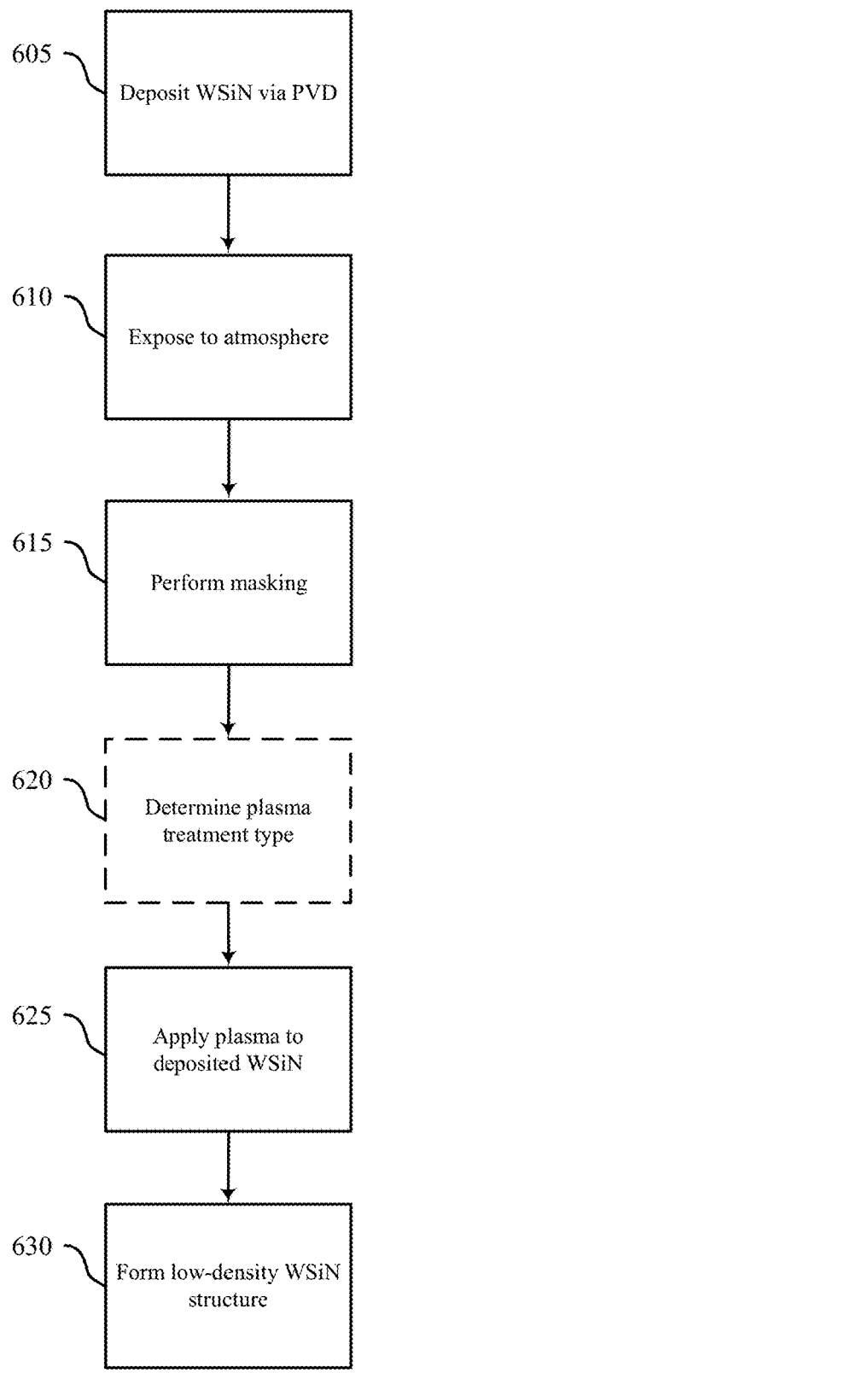
FIG. 6 illustrates an example of a manufacturing process that supports a memory device with a high resistivity thermal barrier in accordance with examples as disclosed herein.

FIG. 6 illustrates an example of a manufacturing process 600 that supports a memory device with a high resistivity (e.g., low density) thermal barrier in accordance with examples as disclosed herein.

At 605, the barrier material may be deposited using PVD (e.g., direct current (DC) magnetron PVD, which may also be known as reactive sputtering). As described herein, the barrier material may be deposited over a stack of memory cells (e.g., memory cells 305 as described with reference to FIG. 3), an oxide region (e.g., an oxide region 310 as described with reference to FIG. 3), and/or a via (e.g., a via 315 as described with reference to FIG. 3). The plasma used in PVD may be a plasma created from argon and dinitrogen molecules (e.g., the PVD may be an $N_2$ reactive PVD). Additionally, the material targeted by the plasma may consist of tungsten and silicon. For instance, the material may be a $WSi_X$ material, where X may refer to a proportion of silicon atoms relative to tungsten atoms in the targeted material. In general X may be a value between or equal to 2 and 4. For instance, X may be equal to 2, 2.1, 2.2, 2.3, 2.4, 2.5, 2.6, 2.7, 2.8, 2.9, 3.0, 3.1, 3.2, 3.3, 3.4, 3.5, 3.6, 3.7, 3.8, 3.9, or 4.0. In some cases, the barrier material may be deposited via chemical vapor deposition (CVD), atomic layer deposition (ALD), or any other deposition method. In some cases, the barrier material may be deposited onto a semiconductor substrate.

At 610, the deposited barrier material may be exposed to atmosphere. Exposing the deposited barrier material to atmosphere may involve a deposition chamber containing the barrier to allow air to enter the deposition chamber. In some cases, the deposition chamber may first create a vacuum to pump out the gas used to create the PVD plasma and may then expose the deposited barrier material to atmosphere. Atmosphere, in the present case, may refer to air located locally around the deposition chamber (e.g., air within a room that contains the deposition chamber) or may refer to air pumped in or otherwise collected from a distance (e.g., air from outside of the room). Although the present example assumes that the deposited barrier material may be exposed to air, it is possible that the deposited barrier material may be exposed to other gases or particular constituents of air (e.g., nitrogen, dinitrogen, oxygen, dioxygen, water vapor, argon, or carbon dioxide).

At 615 a portion of the barrier material may be masked. For example, as described herein, the barrier material may include a first section (e.g., first section 330 as described with reference to FIG. 3) and a second section (e.g., second section 335 as described with reference to FIG. 3). One or both of the sections (or one or more subsets of one or more of the sections) may be masked to apply a plasma to the non-masked section. This may allow for one section (e.g., the non-masked section) to have a lower density—and a higher resistivity—based on the plasma treatment. In some examples, the masked section may correspond to an area above one or more memory cells (e.g., memory cells 305, 405 as described with reference to FIGS. 3 and 4, respectively) or an area over one or more vias (e.g., via 515 as described with reference to FIG. 5). The sections may be masked, for example, by using a reverse polarity chop or based on the reticles of the via(s).

At 620, it may be determined (e.g., by a controller of the deposition chamber or based on one or more other components or readings) what type of plasma treatment to apply to the deposited barrier material. For example, as described with reference to FIG. 4, a plasma treatment to increase the thermal resistivity (e.g., decrease a density) of the barrier material over the memory cells may be desirable. Different types of plasma treatments may use different times of treatment, different deposition chamber temperature functions, different deposition chamber pressure functions, different amounts of constituent molecules (e.g., dinitrogen or helium) used up to make the plasma of the plasma treatment, different plasma powers, or a combination thereof. In some cases, the type of plasma treatment may be determined based on an expected density of a low density barrier material, an expected thickness of the low density barrier material, an expected atomic ratio of tungsten-nitrogen bonds to tungsten-silicon bonds in the low density barrier material, an expected proportion of chemical constituents of the low density barrier material, an expected electrical resistivity of a low density barrier material, or a combination thereof. Additionally or alternatively, different types of plasma treatments may be used under different process conditions.

In some cases, the deposited barrier material being exposed to atmosphere (at 610) may not be performed and a portion of the barrier material may be masked (at 615) or a type of plasma treatment to apply to the deposited barrier material may be determined (at 620) after depositing the barrier material using PVD (at 605). Such cases, in which a portion of the barrier material may be masked (at 615) or a type of plasma treatment to apply to the deposited barrier material may be determined (at 620) directly follows depositing the barrier material using PVD (at 605), may be referred to as in-situ back-to-back processes.

The type of plasma treatment and/or the thickness of the deposited barrier material may affect a density and/or a thickness of a resulting low density barrier material. In one example, a 150 angstroms (Å) barrier material may be deposited and may initially have an initial density and no low density barrier material. The initial density may, in some examples, be between 6.356 and 7.156 grams per cubic centimeters (g/cc), 6.456 and 7.056 g/cc, 6.556 g/cc and 6.956 g/cc, 6.656 g/cc and 6.856 g/cc, or may be about 6.756 g/cc. A first plasma treatment on the deposited barrier material of 150 Å may result in a low density barrier material or a layer of a bilayer structure (e.g., a bulk layer) with a first density and a first low density barrier material thickness. For instance, the first low density barrier material thickness may be between 61 Å and 69 Å, 62 Å and 68 Å, 63 Å and 67 Å, 64 Å and 66 Å, or may be about 65 Å and the first density may be between 3.3 g/cc and 4.1 g/cc, 3.4 g/cc and 4.0 g/cc, 3.5 g/cc and 3.9 g/cc, 3.6 g/cc and 3.8 g/cc, or may be about 3.7 g/cc. A second plasma treatment on the deposited barrier material of 150 Å may result in a low density barrier material or a layer of a bilayer structure with a second density and a second low density barrier material thickness. For instance, the second low density barrier material thickness may be between 74.4 Å and 82.4 Å, 75.4

Å and 81.4 Å, 76.4 Å and 80.4 Å, 77.4 Å and 79.4 Å, or may be about 78.4 Å and the second density may be between 3.12 g/cc and 3.92 g/cc, 3.22 g/cc and 3.82 g/cc, 3.32 g/cc, and 3.72 g/cc, 3.42 g/cc and 3.62 g/cc, or may be about 3.52 g/cc.

In another example, a 50 Å barrier material may be deposited and may have an initial density and no low density barrier material. The initial density may be between 6.365 and 7.165, 6.465 and 7.065, 6.565 and 6.965, 6.655 and 6.865, or may be about 6.765 g/cc. The first plasma treatment on the deposited barrier material of 50 Å may result in a low density barrier material or a layer of a bilayer structure (e.g., a bulk layer) with a first density and a first low density barrier material thickness. The first density may be between 3.35 g/cc and 4.15 g/cc, 3.45 g/cc and 4.05 g/cc, 3.55 g/cc and 3.95 g/cc, 3.65 g/cc and 3.85 g/cc, or may be about 3.75 g/cc. The second plasma treatment on the deposited barrier material of 50 Å may result in a low density barrier material or a layer of a bilayer structure (e.g., a bulk layer) with a second density and a second low density barrier material thickness. The second density may be between 3.11 g/cc and 3.91 g/cc, 3.21 g/cc and 3.81 g/cc, 3.31 g/cc and 3.71 g/cc, 3.41 g/cc and 3.61 g/cc, or may be about 3.51 g/cc.

Additionally or alternatively, the type of plasma treatment and/or the thickness of the deposited barrier material may affect an atomic ratio of tungsten-nitrogen bonds to tungsten-silicon bonds within the resulting low density barrier material. In one example, a 150 Å barrier material may be deposited and may have an initial atomic ratio between 0.31 and 0.39, 0.32 and 0.38, 0.33 and 0.37, 0.34 and 0.36, or may be about 0.35. A first plasma treatment on the deposited barrier material of 150 Å may result in a low density barrier material or a layer of a bilayer structure (e.g., a bulk layer) with an atomic ratio between 0.42 and 0.50, 0.43 and 0.49, 0.44 and 0.48, 0.45 and 0.47, or may be about 0.46. A second plasma treatment on the deposited barrier material of 150 Å may result in a low density barrier material or a layer of a bilayer structure (e.g., a bulk layer) with an atomic ratio between 1.32 and 1.40, 1.33 and 1.39, 1.34 and 1.38, 1.35 and 1.37, or may be about 1.36.

In another example, a 50 Å barrier material may be deposited and may have an atomic ratio between 0.33 and 0.41, 0.34 and 0.40, 0.35 and 0.39, 0.36 and 0.38, or may be about 0.37. The first plasma treatment on the deposited barrier material of 50 Å may result in a low density barrier material or a layer of a bilayer structure (e.g., a bulk layer) with an atomic ratio between 1.32 and 1.40, 1.33 and 1.39, 1.34 and 1.38, 1.35 and 1.37, or may be about 1.36. The second plasma treatment on the deposited barrier material of 50 Å may result in a low density barrier material or a layer of a bilayer structure (e.g., a bulk layer) with an atomic ratio between 1.99 and 2.07, 2.00 and 2.06, 2.01 and 2.05, 2.02 and 2.04, or may be about 2.03.

Additionally or alternatively, the type of plasma treatment and/or the thickness of the deposited barrier material may affect proportions of silicon, tungsten, nitrogen, or a combination thereof in the low density barrier material or a layer of a bilayer structure. For instance, a first plasma treatment may result in a proportion of $W_P SiN_Q$ and a second plasma treatment may result in a proportion of $W_R SiN_S$, where P and R may refer to proportions of tungsten atoms relative to silicon atoms in the low density barrier material. Q and S may refer to proportions of nitrogen atoms relative to silicon atoms in the low density barrier material. P may not be equal to R and Q may not be equal to S. In general, P and R may range from 0.5 to 2.0 and Q and S may range from 0.5 to 2.0.

In general, the deposited barrier material may have a density within a range of density values (e.g., between 6.7 g/cc and 7.7 g/cc, 6 g/cc and 9.2 g/cc, or 6 g/cc and 7.5 g/cc) which may be at least partially due to the PVD process capability and repeatability. In some cases, a lower-bound density of the range of density values may range between 5.5 g/cc and 6.5 g/cc, 5.6 g/cc and 6.4 g/cc, 5.7 g/cc and 6.3 g/cc, 5.8 g/cc and 6.2 g/cc, 5.6 g/cc and 6.1 g/cc, or may be about 6 g/cc. In some cases, a lower-bound density of the range of density values may range between 6.2 g/cc and 7.2 g/cc, 6.3 g/cc and 7.1 g/cc, 6.4 g/cc and 7.0 g/cc, 6.5 g/cc and 6.9 g/cc, 6.6 g/cc and 6.8 g/cc, or may be about 6.7 g/cc. In some cases, an upper-bound density of the range of density values may range between 7.2 g/cc and 8.2 g/cc, 7.3 g/cc and 8.1 g/cc, 7.4 g/cc and 8.0 g/cc, 7.5 g/cc and 7.9 g/cc, 7.6 g/cc and 7.8 g/cc, or may be about 7.7 g/cc. In some cases, an upper-bound density of the range of density values may range between 8.7 g/cc and 9.7 g/cc, 8.8 g/cc and 9.6 g/cc, 8.9 g/cc and 9.5 g/cc, 9.0 g/cc and 9.5 g/cc, 9.1 g/cc and 9.3 g/cc, or may be about 9.2 g/cc. Additionally, the range may be limited by an increasing difficulty in controlling resistivity (e.g., thermal or electrical) as an amount of dinitrogen within the PVD plasma (e.g., a dinitrogen flow) increases.

The low density barrier material may also have a density within a range of density values (e.g., between 3.5 g/cc and 5 g/cc). A lower-bound density of the range of density values for the low density barrier material or a layer of a bilayer structure (e.g., a bulk layer) may range between 3.0 g/cc and 4.0 g/cc, 3.1 g/cc and 3.9 g/cc, 3.2 g/cc and 3.8 g/cc, 3.3 g/cc and 3.7 g/cc, 3.4 g/cc and 3.6 g/cc, or may be about 3.5 g/cc. An upper-bound density of the range of density values for the low density barrier material or a layer of a bilayer structure may range between 4.5 g/cc and 5.5 g/cc, 4.6 g/cc and 5.4 g/cc, 4.7 g/cc and 5.3 g/cc, 4.8 g/cc and 5.2 g/cc, 4.9 g/cc and 5.1 g/cc, or may be about 5 g/cc. Applying plasma treatments may affect the density of the low density barrier material or a layer of a bilayer structure (e.g., a bulk layer) to be below the range of density values for the deposited barrier material, which may decrease the thermal conductivity associated with the low density barrier material relative to the deposited barrier material.

At 625, a plasma may be applied to the deposited barrier material. The plasma may be made from a gas composed of dinitrogen and helium molecules. The plasma may be applied for anywhere within a range of time durations (e.g., 50 seconds to 100 seconds). A lower-bound density of the range of time durations may range between 46 seconds and 54 seconds, 47 seconds and 53 seconds, 48 seconds and 52 seconds, 49 seconds and 51 seconds, or may be about 50 seconds. An upper-bound density of the range of time durations may range between 96 seconds and 104 seconds, 97 seconds and 103 seconds, 98 seconds and 102 seconds, 99 seconds and 101 seconds, or may be about 100 seconds. Additionally, the plasma treatment may be associated with a power anywhere within a range of power values of 1 kW and 2 kW. A lower-bound power of the range of power values may range between 0.6 kilowatts (kW) and 1.4 kW, 0.7 kW and 1.3 kW, 0.8 kW and 1.2 kW, 0.9 kW and 1.1 kW, or may be about 1.0 kW. Additionally or alternatively, the lower-bound power of the range of power values may be a value equal or greater than 0.1 kW or 0.5 kW. An upper-bound power of the range of power values may range between 1.6 kW and 2.4 kW, 1.7 kW and 2.3 kW, 1.8 kW and 2.2 kW, 1.9 kW and 2.1 kW, or may be about 2.0 kW. Additionally or alternatively, the upper bound may be a value equal to greater than 2.0 kW. In some cases, the plasma applied at 625 may be the same as the plasma applied at 605. In some cases, the plasma may be applied based on a target resistivity (e.g., thermal or electrical) of the low density barrier material.

At 630, a low density barrier material may be formed on the exposed surface of a portion (e.g., a section) of the deposited barrier material. For example, with reference to FIG. 3, a low density (and relatively high resistivity) barrier material may be formed over a stack of memory cells 305. The low density barrier material may be formed due to a higher percentage of nitrogen being present at the surface after treatment by the plasma. Additionally or alternatively, the low density barrier material may be formed by tungsten being pulled to a surface of the low density barrier material, which may form a bilayer structure. A first layer of the bilayer structure, at the surface, may be denser than a second layer of the bilayer structure that is adjacent to the first layer, which may be due to the tungsten being pulled to the denser layer of the bilayer structure. The second layer may be less dense than the deposited barrier material and the first layer may be less dense, as dense, or denser than the deposited barrier material. The bilayer structure may have an overall density smaller than the deposited barrier material.

Figure 7A:
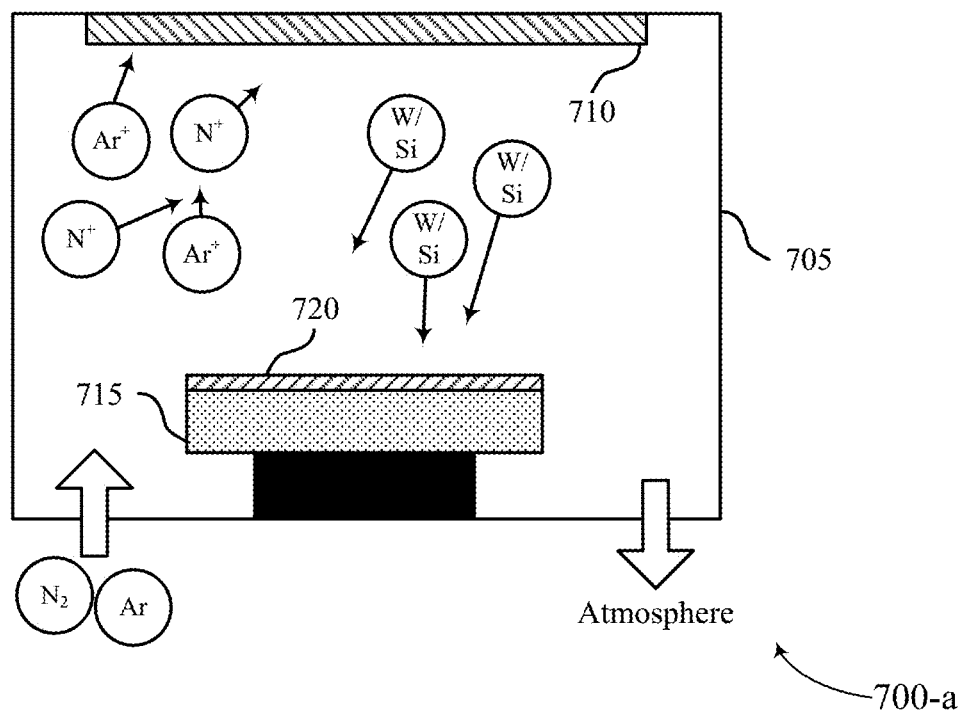
FIGS. 7A and 7B illustrate examples of plasma application processes that supports a memory device with a high resistivity thermal barrier in accordance with examples as disclosed herein.
Figure 7B:
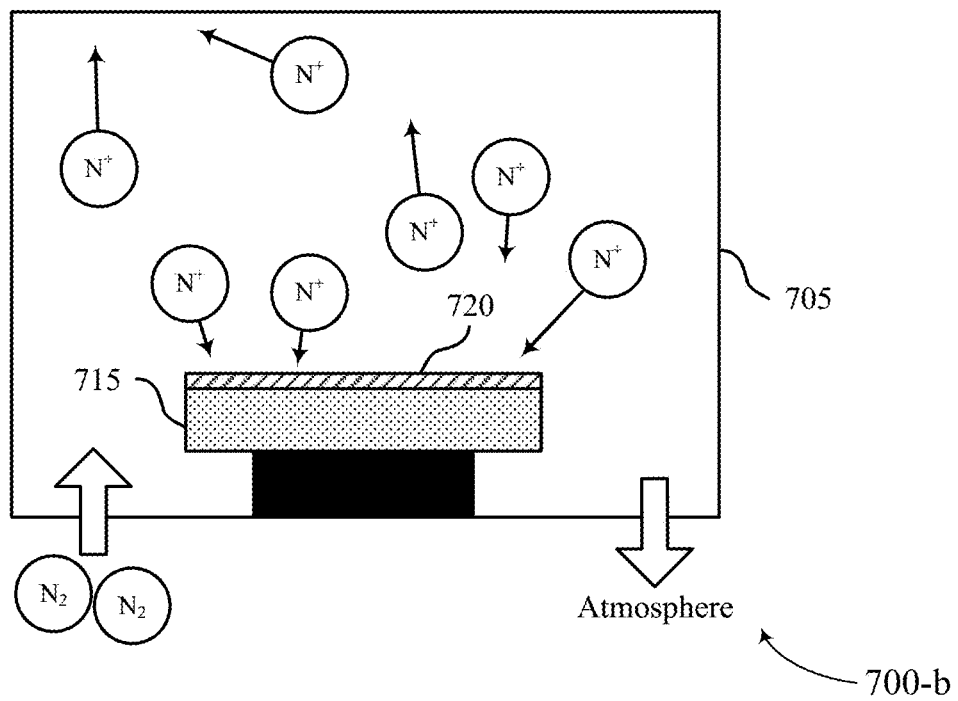

FIGS. 7A and 7B illustrate examples of plasma application processes 700-a and 700-b that support a memory device with a high resistivity thermal barrier in accordance with examples as disclosed herein. In some examples, plasma application processes 700-a and 700-b may implement examples of manufacturing process 600. For instance, plasma application process 700-a may depict an example of processing step 605 as described with reference to FIG. 6. Plasma application process 700-b, meanwhile, may depict an example of processing steps 610 and 625 as described with reference to FIG. 6.

With regards to plasma application process 700-a, atmospheric molecules (e.g., air) may be pumped out of the deposition chamber 705 to create a vacuum. Dinitrogen and argon in gaseous form may enter the deposition chamber 705 and fill the vacuum. The dinitrogen and argon may receive thermal energy (e.g., the dinitrogen and argon may be heated up) until a plasma made up of nitrogen and argon ions is formed. The nitrogen and argon ions may contact the target barrier material 710 (e.g., a $WSi_X$ material with $2 \leq X \leq 4$)) and may knock tungsten and silicon molecules out of the target barrier material 710. The tungsten and silicon molecules may drop to the exposed surface of the memory device 715 (e.g., a top surface of one or more memory cells 305, an oxide region 310, and/or a via 315 as described with reference to FIG. 3) and may begin to form barrier material 720 (e.g., WSiN). As barrier material 720 begins to form, tungsten and silicon molecules may begin to drop onto the exposed surface of barrier material 720 and increase thickness of barrier material 720. The memory device may be on a temperature-controlled platen.

With regards to plasma application process 700-b, atmospheric molecules, such as air, may be pumped out of the deposition chamber 705 to create a vacuum. Dinitrogen and, in some cases, helium may enter the deposition chamber 705 and fill the vacuum. The dinitrogen may receive thermal energy (e.g., the dinitrogen may be heated up using thermal or with radio frequency (RF) radiation) until a plasma made up of nitrogen ions is formed. If helium also entered the deposition chamber 705, the plasma may also include helium ions. The nitrogen ions may contact the surface of the barrier material 720, pull tungsten outwards, and bond with the tungsten. This process may continue until a low density barrier material (e.g., a low density barrier material such as low density barrier material 320 as described with reference to FIG. 3) is formed on the surface of the barrier material 720 or, in cases where all of the barrier material 720 becomes low density barrier material, on the surface of the memory device 715. In some cases, plasma application process 700-b may be referred to as CVD nitridation.

Figure 8:
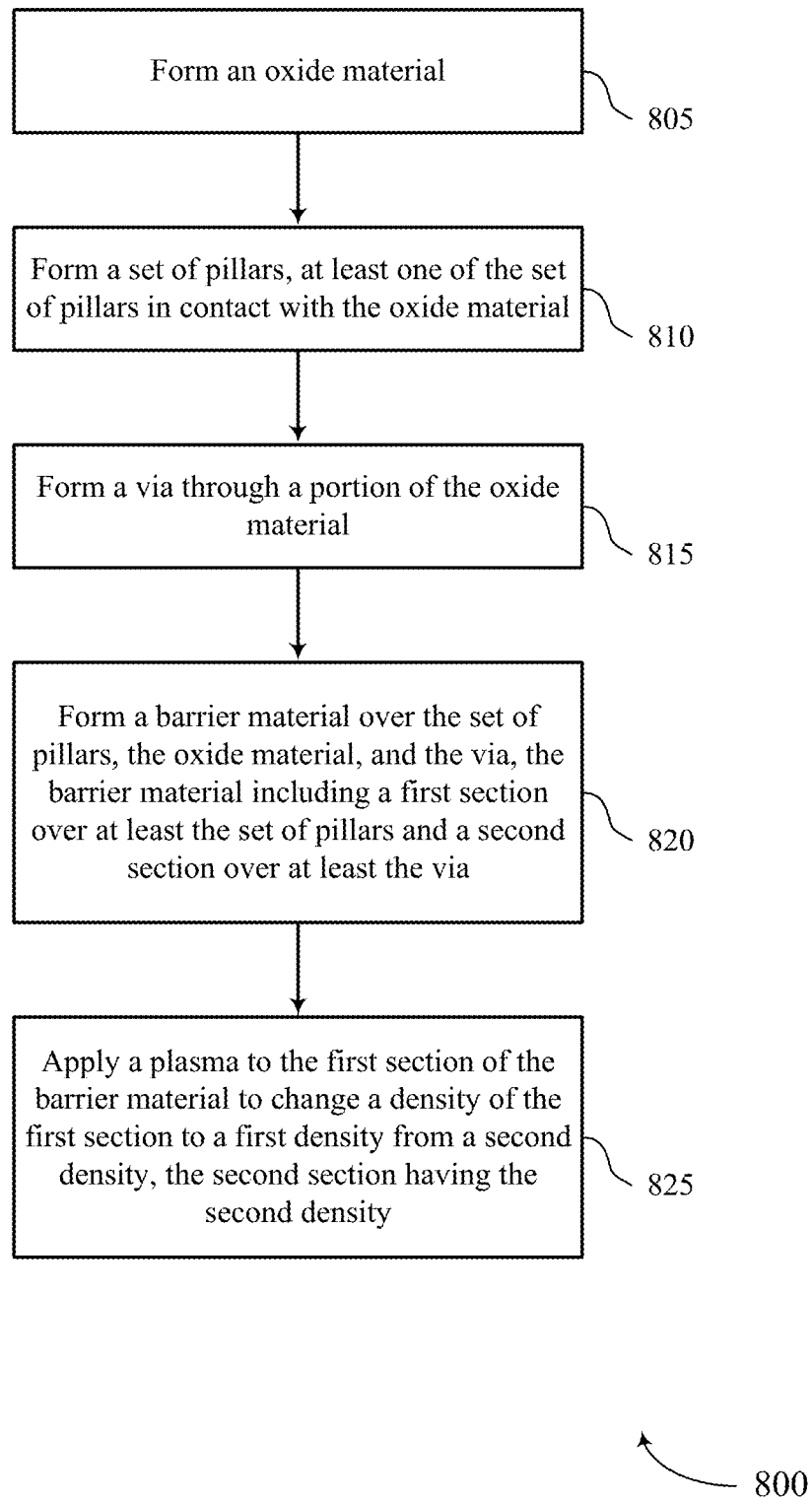
FIGS. 8 through 10 show flowcharts illustrating a method or methods that support a memory device with a high resistivity thermal barrier in accordance with examples as disclosed herein.

FIG. 8 shows a flowchart illustrating a method or methods 800 that supports a memory device with a high resistivity thermal barrier in accordance with aspects of the present disclosure. The operations of method 800 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware. In some examples, a controller implementing the operations of method 800 may be for controlling a deposition control chamber as described with reference to FIGS. 6 and 7.

At 805, the method 800 may include an oxide material being formed. The operations of 805 may be performed according to the methods described herein. In some examples, aspects of the operations of 805 may be performed to fabricate a memory array as described with reference to FIGS. 3 through 5.

At 810, the method 800 may include a set of one or more pillars being formed. In some examples, at least one of the set of pillars may be in contact with the oxide material. The operations of 810 may be performed to fabricate a memory array as described with reference to FIGS. 3 through 5.

At 815, the method 800 may include a via being formed through a portion of the oxide material. The operations of 815 may be performed to fabricate a memory array as described with reference to FIGS. 3 through 5.

At 820, the method 800 may include a barrier material being formed over the set of pillars, the oxide material, and the via. In some examples, the barrier material may include a first section over at least the set of pillars and a second section over at least the via. The operations of 820 may be performed to fabricate a memory array as described with reference to FIGS. 3 through 5.

At 825, the method 800 may include a plasma being applied to the first section of the barrier material to change a density of the first section to a first density from a second density. In some examples, the second section may have the second density. The operations of 825 may be performed to fabricate a memory array as described with reference to FIGS. 3 through 5.

In some examples of the method 800 and the apparatus described herein, applying the plasma may include applying the plasma to a top surface of a top portion of the first section, where the top portion of the first section includes the first density based on applying the plasma.

Some examples of the method 800 and the apparatus described herein may further include determining a target density for the first section of the barrier material, and selecting the barrier material having the second density greater than the target density based on determining the target density, where applying the plasma to the first section of the barrier material may be based on selecting the barrier material to adjust the density of the barrier material from the second density to the first density that may be closer to the target density.

Some examples of the method 800 and the apparatus described herein may further include masking the second section of the barrier material, where applying the plasma to the first section of the barrier material may be based on masking the second section of the barrier material. Some examples of the method 800 and the apparatus described herein may further include etching at least a portion of the oxide material, where the set of pillars may be formed at a location adjacent to the oxide material based on etching at least the portion of the oxide material. Some examples of the method 800 and the apparatus described herein may further include forming an access line above the barrier material, where the access line may be configured to communicate through the barrier material.

In some examples of the method 800 and the apparatus described herein, a dimension of the second section of the barrier material may be the same as a dimension of the via in a first direction. In some examples of the method 800 and the apparatus described herein, the first section of the barrier material may be in contact with at least the set of pillars and the second section of the barrier material may be in contact with at least the via. In some examples of the method 800 and the apparatus described herein, the first density may be lower than the second density. In some examples of the method 800 and the apparatus described herein, the barrier material includes tungsten silicon nitride or the plasma includes dinitrogen, helium, or a combination thereof. In some examples of the method 800 and the apparatus described herein, the barrier material may include a bilayer structure.

Figure 9:
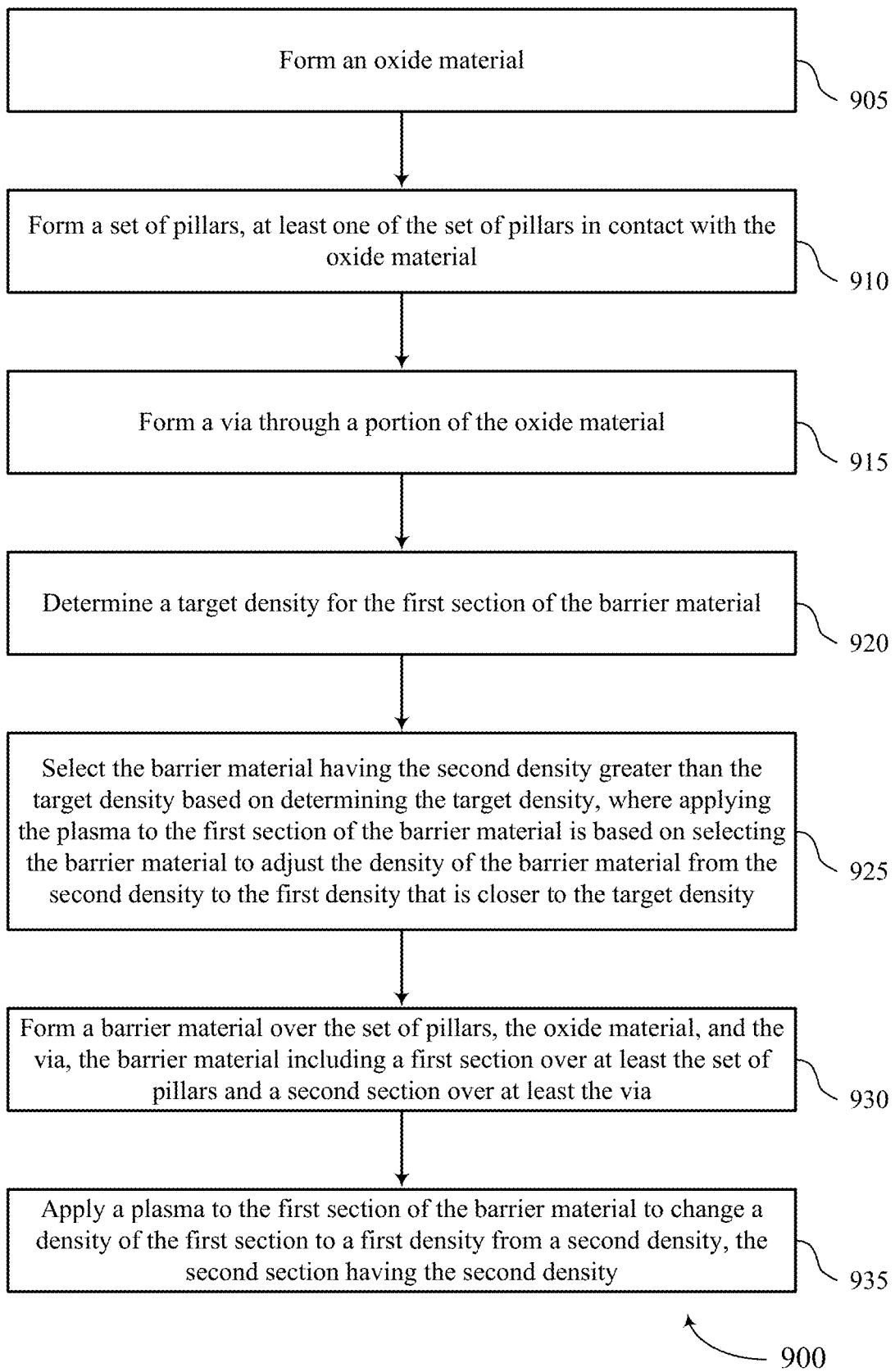

FIG. 9 shows a flowchart illustrating a method or methods 900 that supports a memory device with a high resistivity thermal barrier in accordance with aspects of the present disclosure. The operations of method 900 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware. In some examples, a controller implementing the operations of method 900 may be for controlling a deposition control chamber as described with reference to FIGS. 6 and 7.

At 905, the method 900 may include an oxide material being formed. The operations of 905 may be performed according to the methods described herein. In some examples, aspects of the operations of 905 may be performed to fabricate a memory array as described with reference to FIGS. 3 through 5.

At 910, the method 900 may include a set of pillars being formed. In some examples, at least one of the set of pillars may be in contact with the oxide material. The operations of 910 may be performed to fabricate a memory array as described with reference to FIGS. 3 through 5.

At 915, the method 900 may include a via being formed through a portion of the oxide material. The operations of 915 may be performed to fabricate a memory array as described with reference to FIGS. 3 through 5.

At 920, the method 900 may include a target density for the first section of the barrier material being determined. The operations of 920 may be performed to fabricate a memory array as described with reference to FIGS. 3 through 5.

At 925, the method 900 may include the barrier material having the second density greater than the target density being selected based on determining the target density. In some examples, applying the plasma to the first section of the barrier material is based on selecting the barrier material to adjust the density of the barrier material from the second density to the first density that is closer to the target density. The operations of 925 may be performed to fabricate a memory array as described with reference to FIGS. 3 through 5.

At 930, the method 900 may include a barrier material being formed over the set of pillars, the oxide material, and the via. In some examples, the barrier material may include a first section over at least the set of pillars and a second section over at least the via. The operations of 930 may be performed to fabricate a memory array as described with reference to FIGS. 3 through 5.

At 935, the method 900 may include a plasma being applied to the first section of the barrier material to change a density of the first section to a first density from a second density. In some examples, the second section may have the second density. The operations of 935 may be performed to fabricate a memory array as described with reference to FIGS. 3 through 5.

Figure 10:
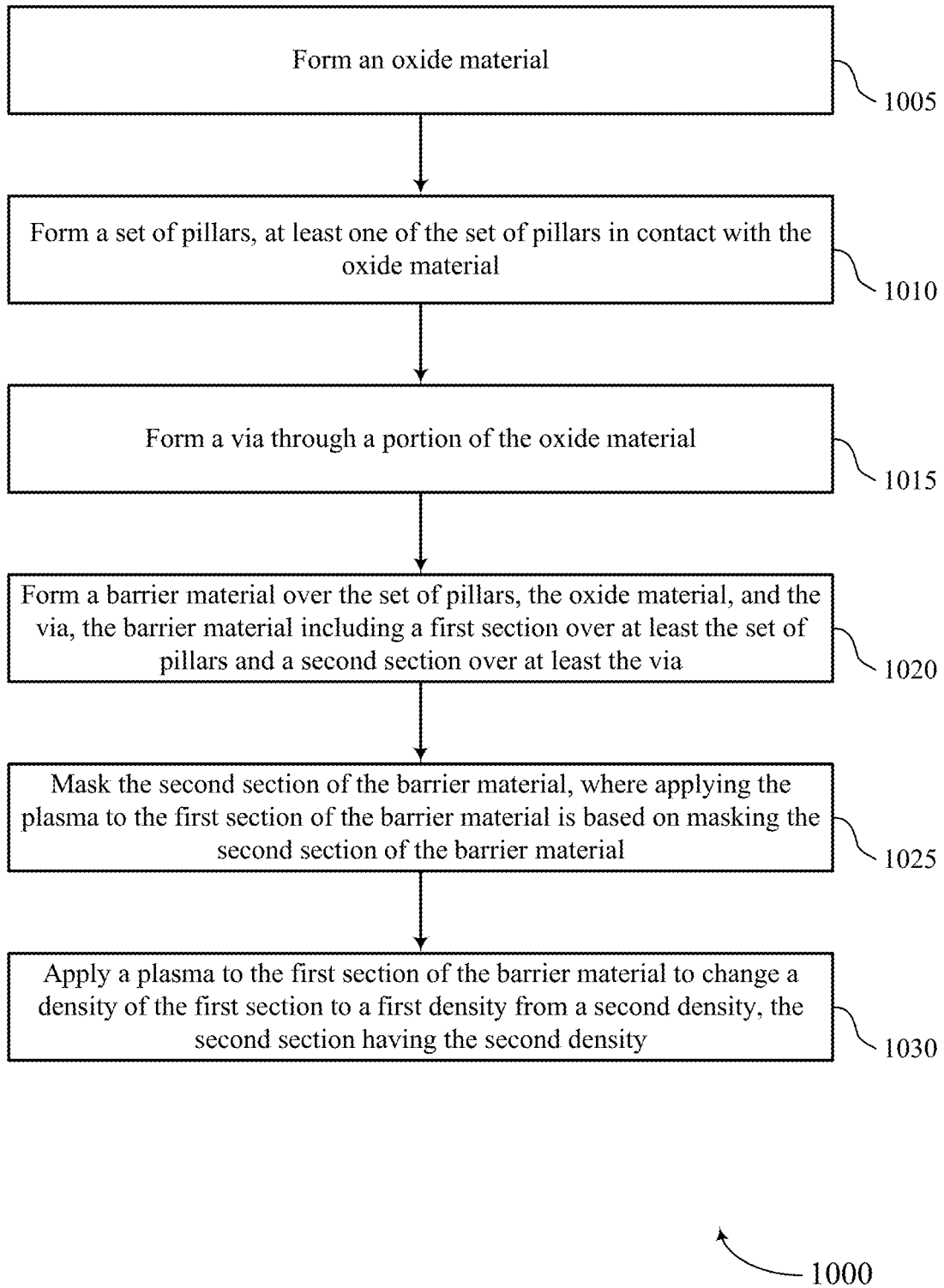

FIG. 10 shows a flowchart illustrating a method or methods 1000 that supports a memory device with a high resistivity thermal barrier in accordance with aspects of the present disclosure. The operations of method 1000 may be implemented by a manufacturing system or one or more controllers associated with a manufacturing system. In some examples, one or more controllers may execute a set of instructions to control one or more functional elements of the manufacturing system to perform the described functions. Additionally or alternatively, one or more controllers may perform aspects of the described functions using special-purpose hardware. In some examples, a controller implementing the operations of method 1000 may be for controlling a deposition control chamber as described with reference to FIGS. 6 and 7.

At 1005, the method 1000 may include an oxide material being formed. The operations of 1005 may be performed to fabricate a memory array as described with reference to FIGS. 3 through 5.

At 1010, method 1000 may include a set of pillars being formed. In some examples, at least one of the set of pillars may be in contact with the oxide material. The operations of 1010 may be performed to fabricate a memory array as described with reference to FIGS. 3 through 5.

At 1015, method 1000 may include a via being formed through a portion of the oxide material. The operations of 1015 may be performed to fabricate a memory array as described with reference to FIGS. 3 through 5.

At 1020, method 1000 may include a barrier material being formed over the set of pillars, the oxide material, and the via. In some examples, the barrier material may include a first section over at least the set of pillars and a second section over at least the via. The operations of 1020 may be performed to fabricate a memory array as described with reference to FIGS. 3 through 5.

At 1025, method 1000 may include the second section of the barrier material being masked. In some examples, applying the plasma to the first section of the barrier material may be based on masking the second section of the barrier material. The operations of 1025 may be performed to fabricate a memory array as described with reference to FIGS. 3 through 5.

At 1030, method 1000 may include a plasma being applied to the first section of the barrier material to change a density of the first section to a first density from a second density. In some examples, the second section may have the second density. The operations of 1030 may be performed to fabricate a memory array as described with reference to FIGS. 3 through 5.

It should be noted that the methods described above describe possible implementations, and that the operations and the steps may be rearranged or otherwise modified and that other implementations are possible. Furthermore, portions from two or more of the methods may be combined.

An apparatus is described. The apparatus may include a set of pillars located above a substrate, each of the pillars including a memory cell, an oxide region located above the substrate, a via extending through the oxide region to the substrate, a barrier material located above at least the set of pillars, the oxide region, and the via, the barrier material including a first section having a first density and a second section having a second density, and an access line located above the barrier material and configured to communicate with the set of memory cells.

In some examples, the first section of the barrier material may be located above at least some of the set of pillars and a first section of the oxide region, and the second section of the barrier material may be located above at least the via and a second section of the oxide region. In some examples, the first section of the barrier material may be located above the set of pillars and at least a first section of the oxide region and the second section of the barrier material may be located above the via, the second section of the barrier material corresponding to a width of the via nearest the barrier material.

In some examples, the second section of the barrier material may be limited to an area the same as an area of an end of the via. Some examples of the apparatus may include circuitry, in contact with the substrate, configured to communicate signals with each of the set of memory cells through the via and the access line. In some examples, the second density may be greater than the first density. Some examples may further include at least a first portion of the first section of the barrier material includes dinitrogen.

In some examples, the barrier material includes tungsten silicon nitride, and where the first portion of the first section of the barrier material may have a higher density of tungsten-nitrogen bonds than the second section of the barrier material. In some examples, the barrier material may be configured to thermally insulate the set of memory cells from the access line. In some examples, each of the set of memory cells include a storage element and a selector device. In some examples, the oxide region may be in contact with at least one of the set of pillars. In some examples, the oxide region may be located on a first side of the via and a second side of the via.

An apparatus is described. The apparatus may include a pillar including a memory cell and located above a substrate, an oxide region located above the substrate and in contact with the pillar, a via in contact with and extending through the oxide region to the substrate, a barrier material including a first section and a second section, the first section having a first resistivity and in contact with at least the pillar, and the second section having a second resistivity and in contact with at least the via, and an access line in contact with the barrier material and configured to communicate signaling to the memory cell.

In some examples, the first section of the barrier material may be in contact with at least a section of the access line, the section different than a second section of the access line that may be directly above the via.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The term "layer" used herein refers to a stratum or sheet of a geometrical structure. Each layer may have three dimensions (e.g., height, width, and depth) and may cover at least a portion of a surface. For example, a layer may be a three-dimensional structure where two dimensions are greater than a third, e.g., a thin-film. Layers may include different elements, components, and/or materials. In some cases, one layer may be composed of two or more sublayers. In some of the appended figures, two dimensions of a three-dimensional layer are depicted for purposes of illustration. Those skilled in the art will, however, recognize that the layers are three-dimensional in nature.

As used herein, the term "substantially" means that the modified characteristic (e.g., a verb or adjective modified by the term substantially) need not be absolute but is close enough to achieve the advantages of the characteristic.

As used herein, the term "electrode" may refer to an electrical conductor, and in some cases, may be employed as an electrical contact to a memory cell or other component of a memory array. An electrode may include a trace, wire, conductive line, conductive layer, or the like that provides a conductive path between elements or components of memory array.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are signals), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method, comprising:
    forming an oxide material;
    forming a plurality of pillars, at least one of the plurality of pillars in contact with the oxide material;
    forming a via through a portion of the oxide material;
    forming a barrier material over the plurality of pillars, the oxide material, and the via, the barrier material comprising a first section over at least the plurality of pillars and a second section over at least the via; and
    applying a plasma to the first section of the barrier material to change a density of the first section to a first density from a second density, the second section having the second density.

2. The method of claim 1, wherein applying the plasma comprises:
applying the plasma to a top surface of a top portion of the first section, wherein the top portion of the first section comprises the first density based at least in part on applying the plasma.

3. The method of claim 1, further comprising:
determining a target density for the first section of the barrier material; and
selecting the barrier material having the second density greater than the target density based at least in part on determining the target density, wherein applying the plasma to the first section of the barrier material is based at least in part on selecting the barrier material to adjust the density of the barrier material from the second density to the first density that is closer to the target density.

4. The method of claim 1, further comprising:
masking the second section of the barrier material, wherein applying the plasma to the first section of the barrier material is based at least in part on masking the second section of the barrier material.

5. The method of claim 1, further comprising:
etching at least a portion of the oxide material, wherein the plurality of pillars are formed at a location adjacent to the oxide material based at least in part on etching at least the portion of the oxide material.

6. The method of claim 1, further comprising:
forming an access line above the barrier material, wherein the access line is configured to communicate through the barrier material.

7. The method of claim 1, wherein a dimension of the second section of the barrier material is the same as a dimension of the via in a first direction.

8. The method of claim 1, wherein the first section of the barrier material is in contact with at least the plurality of pillars and the second section of the barrier material is in contact with at least the via.

9. The method of claim 8, wherein the first density is lower than the second density.

10. The method of claim 1, wherein the barrier material comprises tungsten silicon nitride or wherein the plasma comprises dinitrogen, helium, or a combination thereof.

11. The method of claim 1, wherein the barrier material comprises a bilayer structure.

* * * * *